(12) United States Patent
Phan et al.

(10) Patent No.: US 12,685,152 B2
(45) Date of Patent: Jul. 14, 2026

(54) MESH INDUCTORS AND ANTENNAS OF ELECTRONIC ASSEMBLIES

(71) Applicant: Super Micro Computer, Inc., Fremont, CA (US)

(72) Inventors: Manhtien V. Phan, San Jose, CA (US); Chih-Hao Lee, New Taipei City (TW)

(73) Assignee: Super Micro Computer, Inc., San Jose, CA (US)

( * ) Notice: Subject to any disclaimer, the term of this patent is extended or adjusted under 35 U.S.C. 154(b) by 378 days.

(21) Appl. No.: 18/471,979

(22) Filed: Sep. 21, 2023

(65) Prior Publication Data

US 2025/0105143 A1 Mar. 27, 2025

(51) Int. Cl.

| | |
|---|---|
| *H10W 20/40* | (2026.01) |
| *H01F 27/28* | (2006.01) |
| *H01Q 1/22* | (2006.01) |
| *H10W 44/20* | (2026.01) |

(52) U.S. Cl.
CPC ...... *H10W 20/497* (2026.01); *H01F 27/2804* (2013.01); *H01Q 1/2283* (2013.01); *H10W 44/20* (2026.01); *H10W 44/248* (2026.01)

(58) Field of Classification Search
CPC ................. H01L 23/5227; H01L 23/63; H01L 2223/6677; H01L 23/66; H01F 27/2804; H01F 27/306; H01F 17/04; H01F 27/06; H01F 2027/065; H01Q 1/2283; H01Q 7/06; H10W 20/497; H10W 44/20; H10W 44/248

USPC ......................................................... 257/531
See application file for complete search history.

(56) References Cited

U.S. PATENT DOCUMENTS

| | | | | |
|---|---|---|---|---|
| 9,807,882 | B1 * | 10/2017 | Berdy ................... | H01L 23/645 |
| 2005/0146403 | A1 * | 7/2005 | Okubora ........... | H01L 23/49833 |
| | | | | 257/E23.063 |
| 2007/0003781 | A1 * | 1/2007 | de Rochemont ........ | H01Q 1/38 |
| | | | | 428/615 |
| 2009/0243034 | A1 * | 10/2009 | Stribley ................... | H10D 1/20 |
| | | | | 257/E29.325 |
| 2017/0040695 | A1 * | 2/2017 | Rajagopalan ........... | H02J 50/10 |

OTHER PUBLICATIONS

"Antenna Theory—Quick Guide", Tutorialspoint, Downloaded Aug. 18, 2023, https://www.tutorialspoint.com/antenna_theory/antenna_theory_quick_guide.htm.
"FR-4", Wikipedia, Downloaded May 5, 2023, https://en.wikipedia.org/wiki/FR-4.
"Inductor", Wikipedia, Downloaded May 5, 223, https://en.wikipedia.org/wiki/Inductor#:~:text=An.
(Continued)

*Primary Examiner* — Monica D Harrison
(74) *Attorney, Agent, or Firm* — Beyer Law Group LLP

(57) ABSTRACT

An electronic assembly has a substrate and an inductor. The inductor has a wire that turns several times through the substrate by way of through holes. The wire, by way of the through holes, winds for several turns along a dimension and winds for several turns along another dimension. The wire in turns along a dimension crosses the wire in turns along the other dimension. The inductor is electrically connected to an electrical circuit and can be used as a discrete component or antenna of the electrical circuit.

16 Claims, 24 Drawing Sheets

(56) References Cited

OTHER PUBLICATIONS

"Via (Electronics)", Wikipedia, Downloaded Aug. 25, 2023, https://en.wikipedia.org/wiki/Via_(electronics)#:~:text=In%20integrated%20circuit%20(IC)%20design,-silicon%20via%20(TSV).

Zachariah Peterson, "What is a PCB?", Altium, Aug. 28, 2021, Downloaded May 5, 2023, https://resources.altium.com/p/what-is-a-pcb.

"Monopole antenna", Wikipedia, https://en.wikipedia.org/wiki/Monopole_antenna#:~:text=A, downloaded May 10, 2023.

* cited by examiner

100

101

130

100

101

101

101

100C

101

101

101

MESH INDUCTORS AND ANTENNAS OF ELECTRONIC ASSEMBLIES

TECHNICAL FIELD

The present disclosure is directed to inductors and antennas.

BACKGROUND

An inductor is a well-known component employed in many electronic devices. Inductors may be employed as a discrete component of an electrical circuit or as an antenna. Due to their bulky structure, which comprises a wire that is wound a plurality of turns, inductors are usually taller and larger than most other components in an electronic device. The continually shrinking form factor of today's electronic devices requires inductors that can fit in a relatively small housing. The physical size of inductors become more of an issue with slim electronic devices, such as smart phones, tablets, etc.

BRIEF SUMMARY

In one embodiment, an electronic assembly comprises a substrate and an inductor. The substrate has a plurality of through holes that go through the substrate. The inductor comprises a wire that is disposed to wind by way of the through holes a first plurality of turns and a second plurality of turns, the second plurality of turns crosses over the first plurality of turns, and the wire extends a length between through holes of the plurality of through holes. The electronic assembly further includes an electrical circuit that is electrically connected to the inductor.

In another embodiment, an electronic assembly comprises a substrate and an inductor. The substrate has a plurality of through holes that go through the substrate. The inductor comprises a wire that is disposed to wind by way of the through holes a first plurality of turns and a second plurality of turns, the second plurality of turns crosses over the first plurality of turns, and the wire extends a length between through holes of the plurality of through holes. The substrate has a cutout that is cut through the substrate, and the continuous wire is wrapped around the cutout. The cutout may accept a partial or full magnetic core of the inductor.

In yet another embodiment, an inductor comprises a continuous piece of wire that is wound around an axis a first plurality of turns, and is wound a second plurality of turns around the first plurality of turns. The second plurality of turns crosses over the first plurality of turns, lengths of the wire in the first plurality of turns are spaced apart, and lengths of the wire in the second plurality of turns are spaced apart. The wire extends between turns, giving the inductor a rectangular box profile with shallow depth.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference labels refer to similar elements throughout the figures. The drawings are not necessarily drawn to scale.

DETAILED DESCRIPTION

In the present disclosure, numerous specific details are provided, such as examples of components, structures, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
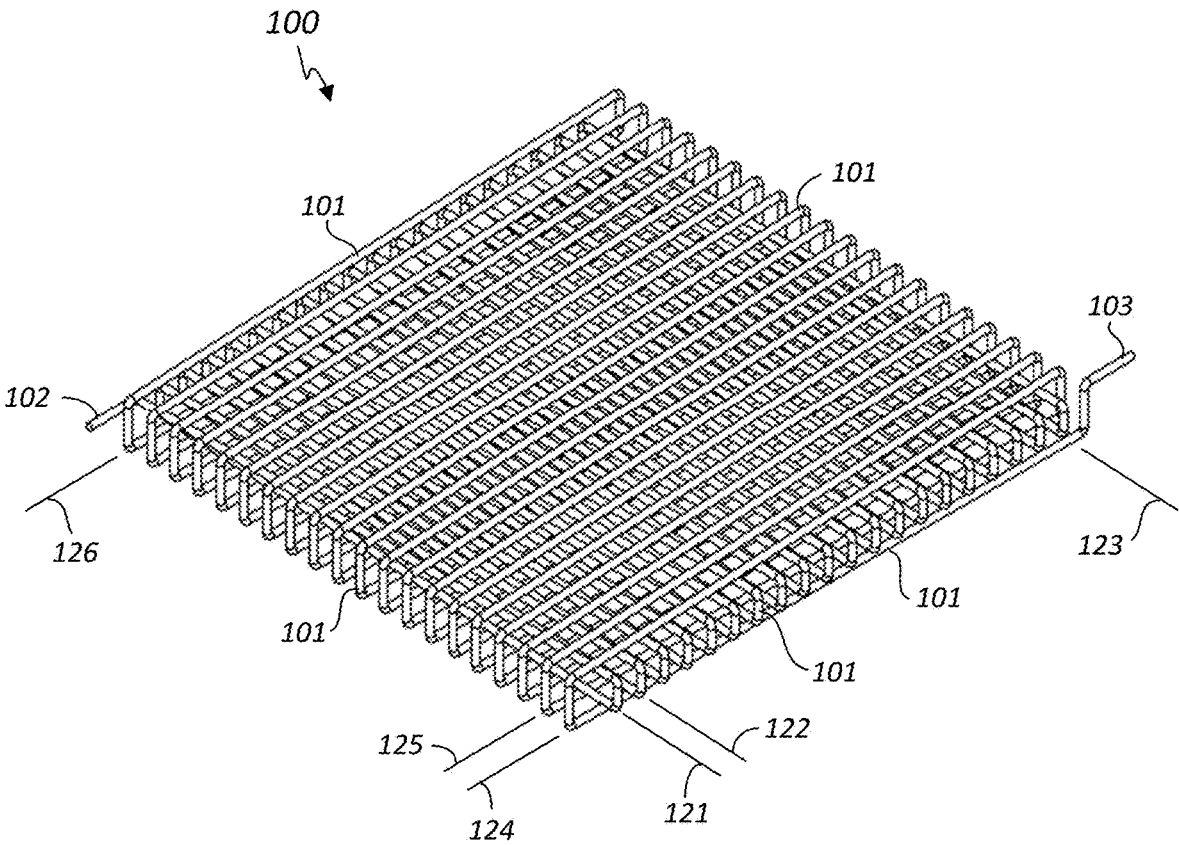
FIG. 1 shows a perspective view of an inductor, in accordance with an embodiment of the present invention.

FIG. 1 shows a perspective view of an inductor 100, in accordance with an embodiment of the present invention. The inductor 100 comprises a single piece of wire 101 that is continuous from a first end 102 to a second end 103. The inductor 100 may comprise an electrical conductor that is coated with an electrically insulating material, such as a copper wire that is coated with enamel. The diameter of the wire 101 depends on the target inductance, e.g., 5 mils, 30 mils, etc. Generally, the inductance of an inductor disclosed herein may be adjusted by varying the physical dimensions of the inductor, number of tuns of the wire 101, and/or the diameter of the wire 101, and may be confirmed or determined using simulation software, for example.

The inductor 100 has a mesh structure in that the wire 101 is wound a first plurality of turns around a core region (air in the example of FIG. 1), and is wound a second plurality of turns around the core region and the first plurality of turns. Lengths of the wire 101 in the second plurality of turns cross over lengths of the wire in the first plurality of turns. As can be appreciated, outer lengths of the wire 101 do not necessarily have to cross. The wire 101 extends along a first dimension between turns in the first plurality of turns and extends along a second dimension between turns in the second plurality of turns, the first and second dimensions cross each other. The extensions of the wire 101 along the first and second dimensions give the inductor 100 a relatively thin (short height) rectangular box profile suitable for slim electronic devices.

In the example of FIG. 1, the lengths of the wire 101 in the first plurality of turns are spaced apart (i.e., do not touch), and the lengths of the wire 101 in the second plurality of turns are also spaced apart. The core region is air in the example of FIG. 1. As will be more apparent below, the inductor 100 may have a magnetic core. That is, the wire 101 may be wound a first plurality of turns around a magnetic core, and wound a second plurality of turns around the magnetic core and the first plurality of turns, with the second plurality of turns crossing over the first plurality of turns.

In the example of FIG. 1, the inductor 100 has 20×20 turns in that the wire 101 has 20 turns along a first dimension (see lines 121, 122, and 123) and 20 turns along a second dimension (see lines 124, 125, and 126). As will be more apparent below, inductors in accordance with embodiments of the present invention may also have different turn configurations, such as 20×15 turns, 20×10 turns, 20×5 turns, etc.

Figure 2:
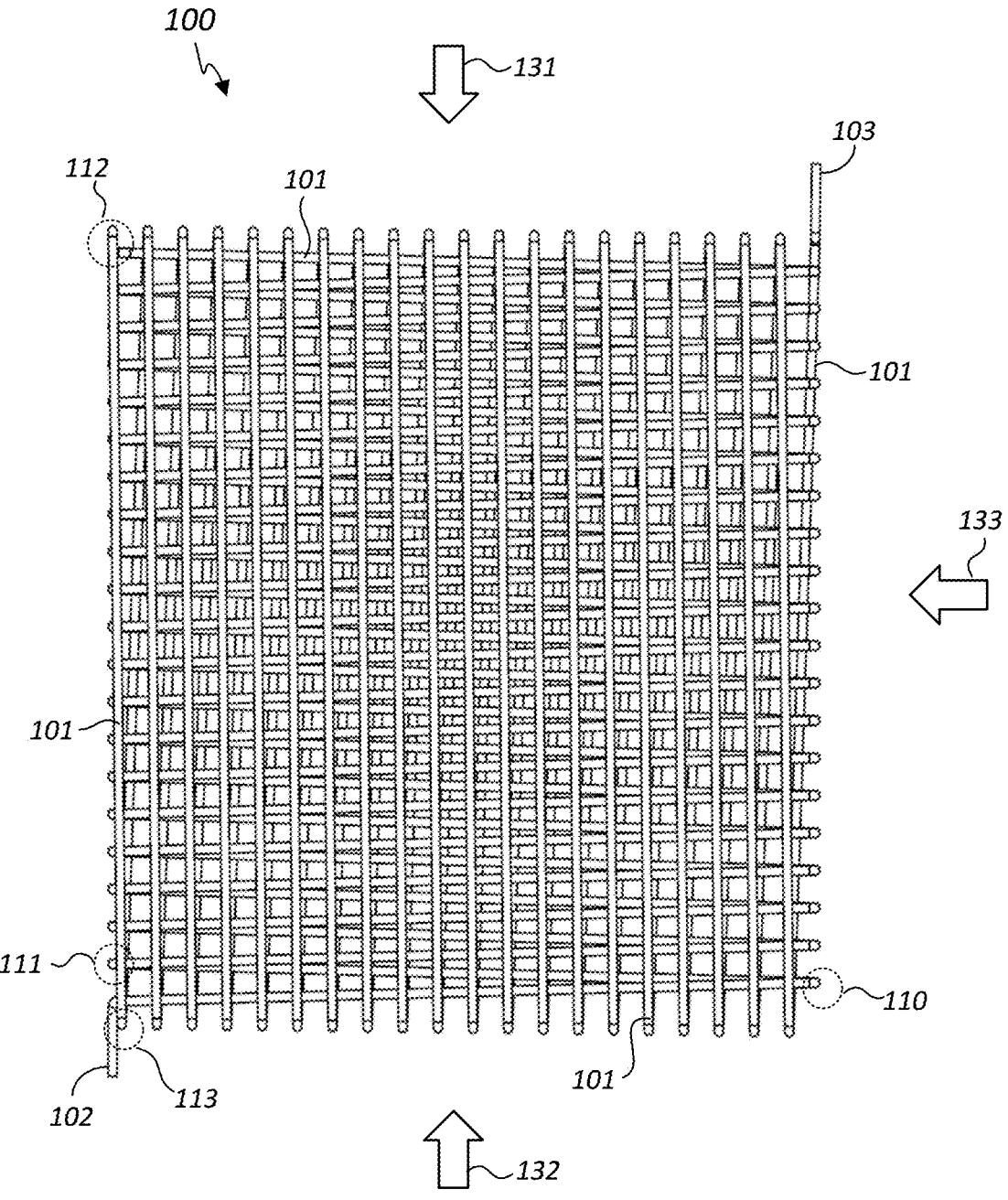
FIG. 2 shows a top view of the inductor of FIG. 1, in accordance with an embodiment of the present invention.

FIG. 2 shows a top view of the inductor 100, in accordance with an embodiment of the present invention. Arrows 131-133 provide reference to side views that are later described with reference to FIGS. 5-7, respectively.

Referring to FIG. 2, the wire 101 starts from the first end 102 and extends a predetermined length along a horizontal dimension in a first direction (toward the right) toward a bend 110, where the wire 101 is turned around back along the horizontal dimension in a second direction (toward the left) at an angle that allows the wire 101 to wind around a plurality of turns. From the bend 110, the wire 101 is turned around to extend along the horizontal dimension in the second direction opposite the first direction a predetermined length toward a bend 111, where the wire 101 is turned around to again extend along the horizontal dimension in the first direction at an angle that allows the wire 101 to wind around a plurality of turns. The wire 101 is wound around the core region (air in FIG. 2) a plurality of turns this way until arriving at a corner bend 112.

At the corner bend 112, the wire 101 is bent to extend a predetermined length along a vertical dimension in a third direction (downwards) toward a bend 13, where the wire 101 is turned around back along the vertical dimension in a fourth direction (upwards) at an angle that allows the wire 101 to wind around a plurality of turns. From the bend 113, the wire 101 is bent to extend along the vertical dimension in the fourth direction opposite the third direction a predetermined length, etc. The wire 101 is wound around the core region and the lengths of wire 101 along the horizontal dimension several times this way until arriving at the second end 103.

Figure 3:
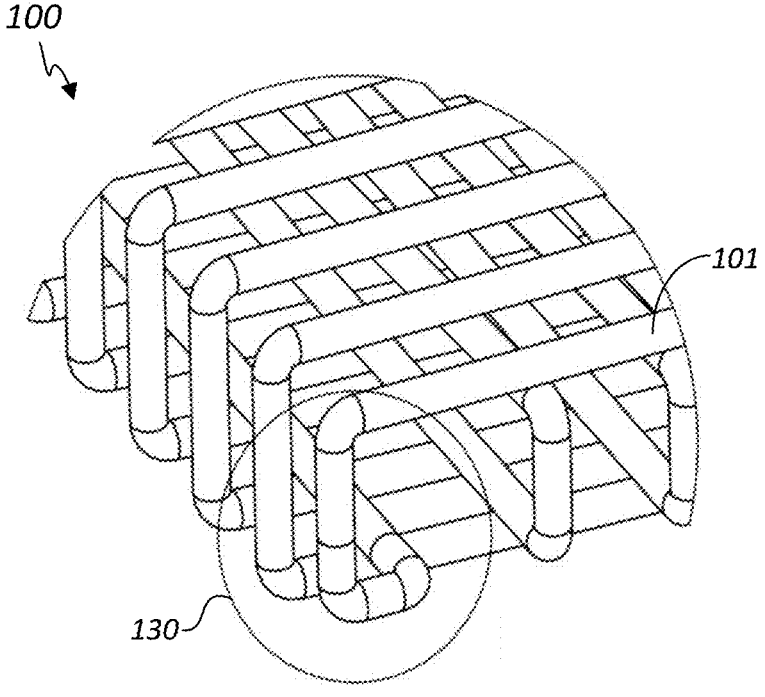
FIGS. 3 and 4 show magnified views of the inductor of FIG. 1, in accordance with an embodiment of the present invention.
Figure 4:
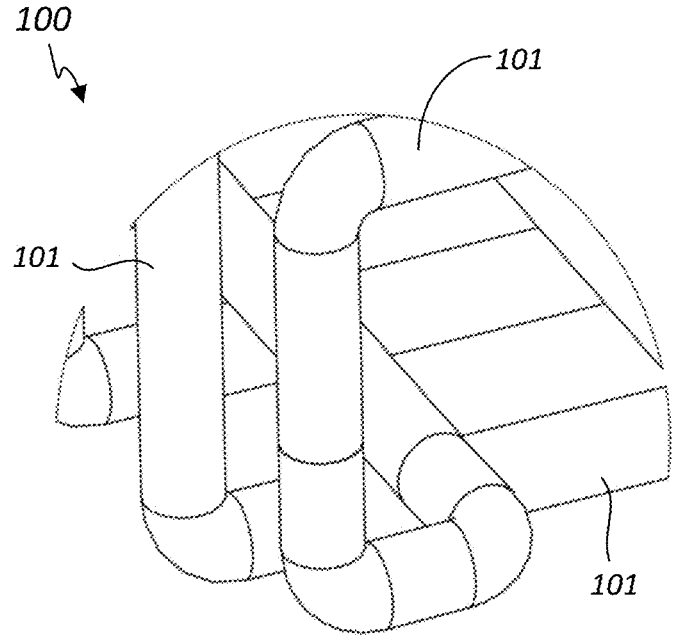

FIG. 3 shows a magnified view of a corner bend of the inductor 100, in accordance with an embodiment of the present invention. A portion 130 of FIG. 3 is further magnified and shown in FIG. 4 for clarity of illustration. Referring to FIG. 4, the wire 101 is bent so as to change extension direction. The wire 101 is bent at angles of approximately 90 degrees to change extension direction for illustration purposes only. As can be appreciated, the wire 101 may be bent and routed various ways to change direction to accommodate different applications or housing form factors.

Figure 5:
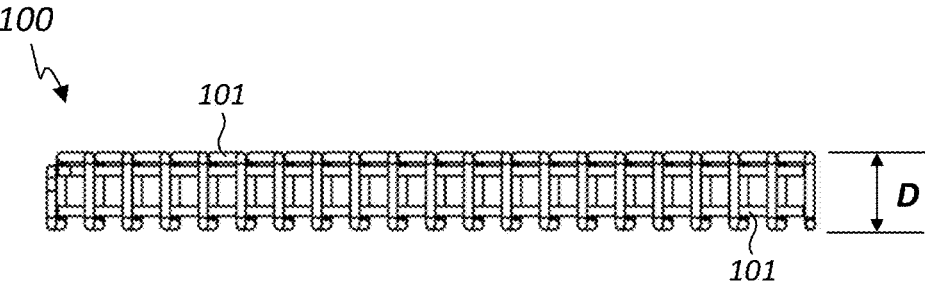
FIGS. 5-7 show side views of the inductor of FIG. 1, in accordance with an embodiment of the present invention.
Figure 6:
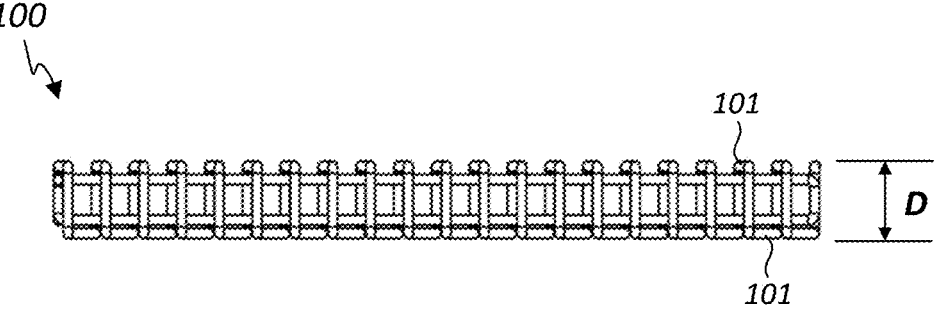
Figure 7:
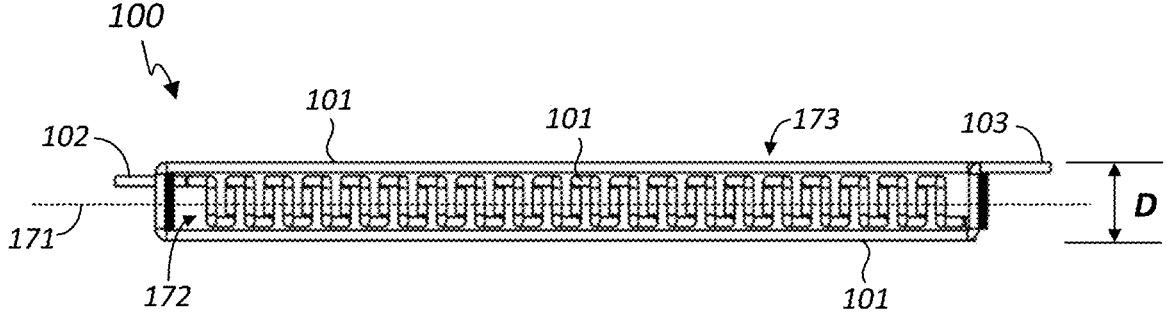

FIGS. 5-7 show side views of the inductor 100, in accordance with an embodiment of the present invention. FIG. 5 shows a side view of the inductor 100 as seen in the direction of arrow 131 of FIG. 2, FIG. 6 shows a side view of the inductor 100 as seen in the direction of arrow 132 of FIG. 2, and FIG. 7 shows a side view of the inductor 100 as seen in the direction of arrow 133 of FIG. 2. The inductor 100 has a rectangular box shape with a thickness D.

Referring to FIG. 7, the wire 101 is wound around an axis 171 a first plurality of turns into the page of FIG. 7 (see FIG. 7, 172). The wire 101 is wound a second plurality of turns around the first plurality of turns (see FIG. 7, 173). That is, lengths of the wire 101 in the second plurality of turns are outside lengths of the wire 101 in the first plurality of turns.

The inductor 100 has an air core in these examples. In some embodiments, a magnetic core may be placed along the axis 171. In that case, the wire 101 winds around the magnetic core a first plurality of turns, and winds a second plurality of turns around the first plurality of turns and the magnetic core. The wire 101 is wound so as not to exceed a specified thickness D. Particular thickness D and inductance requirements may be met by changing the length of the wire extensions and/or the number of turns in each dimension.

Figure 8A:
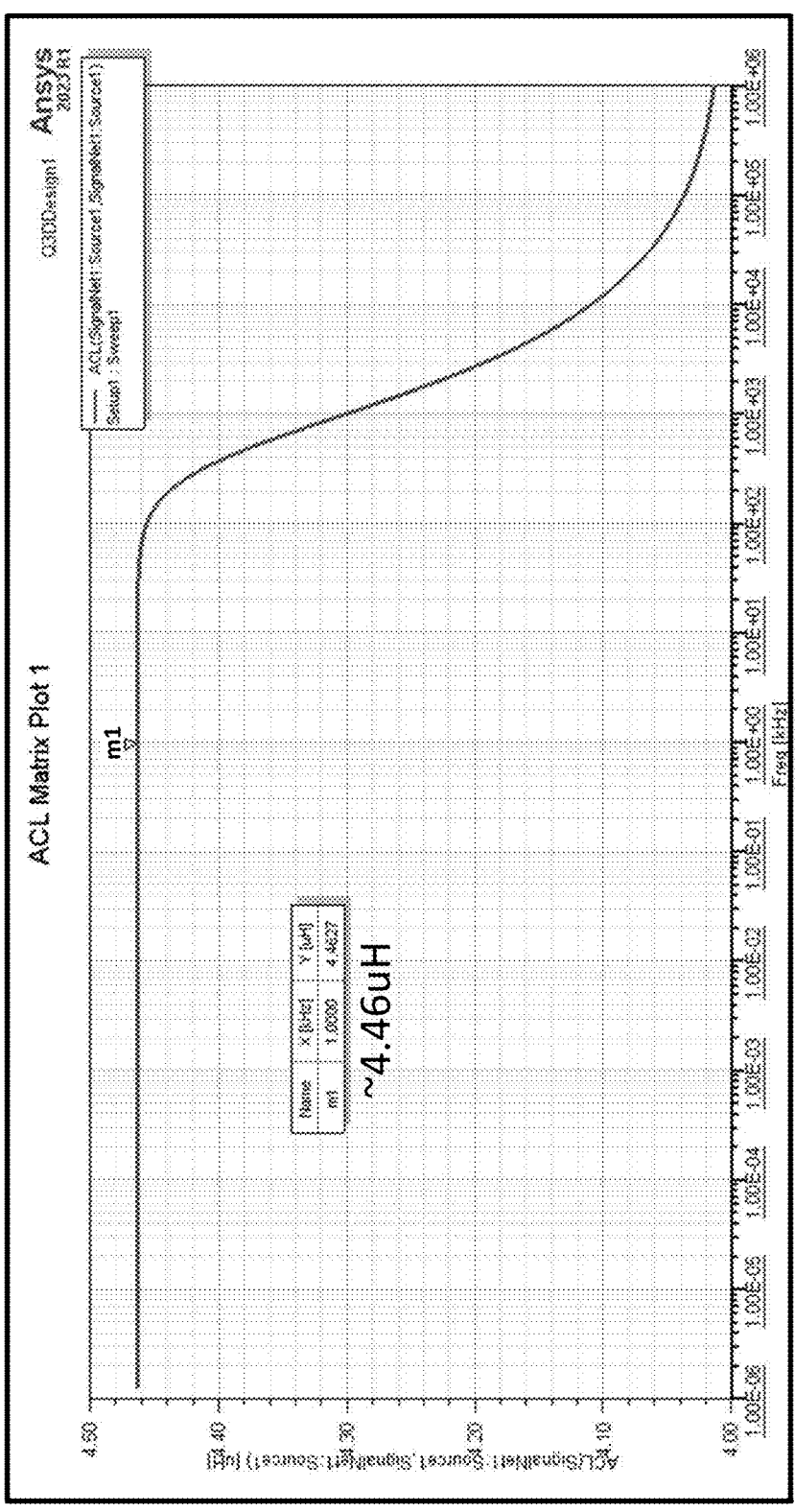
FIG. 8A shows a plot of inductance versus frequency from a simulation of the inductor of FIG. 1, in accordance with an embodiment of the present invention.

FIG. 8A shows a plot of inductance versus frequency from a simulation of the inductor 100, in accordance with an embodiment of the present invention. The simulation was performed using the ANSYS 2023 R1 simulation software, which is commercially-available from ANSYS, Inc. In the simulation of FIG. 8A, the wire 101 is a copper wire with a wire diameter of 30 mils; the inductor 100 has side dimensions of 60 mm×60 mm. In FIG. 8A, the vertical axis represents inductance in µH and the horizontal axis represents frequency in kHz. For reference, at the point m1 in FIG. 8A, the inductor 100 in the simulation has an inductance of around 4.46 µH at around 1 kHz.

Figure 8B:
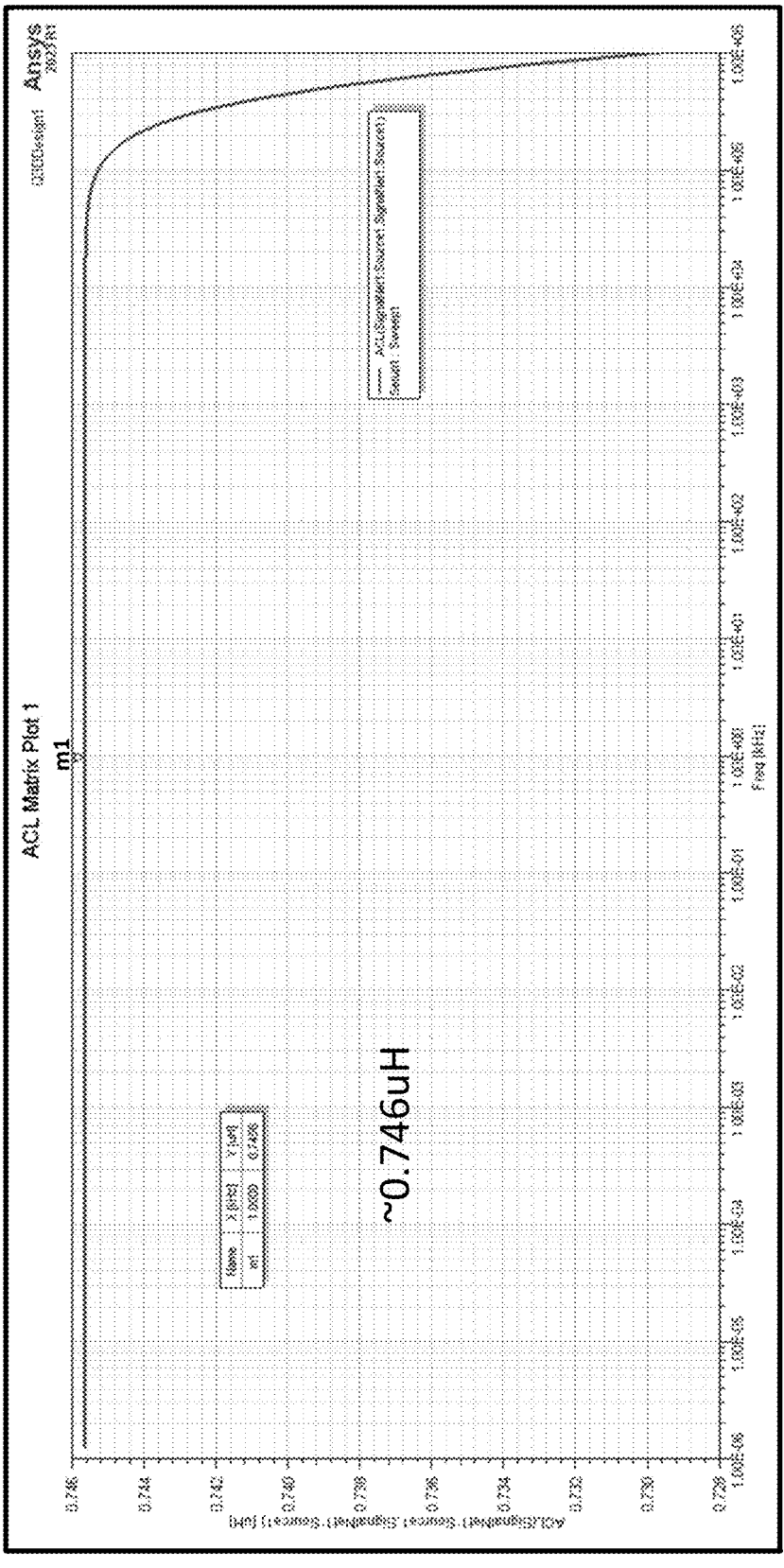
FIG. 8B shows a plot of inductance versus frequency from another simulation of the inductor of FIG. 1, in accordance with an embodiment of the present invention.

FIG. 8B shows a plot of inductance versus frequency from another simulation of the inductor 100, in accordance with an embodiment of the present invention. The simulation was performed using the ANSYS 2023 R1 simulation software. In the simulation of FIG. 8B, the wire 101 is a copper wire with a wire diameter of 5 mils, and the inductor 100 has side dimensions of 10 mm×10 mm. In FIG. 8B, the vertical axis represents inductance in µH and the horizontal axis represents frequency in kHz. For reference, at the point m1 in FIG. 8B, the inductor 100 in the simulation has an inductance of around 0.746 µH at around 1 kHz.

Figure 9:
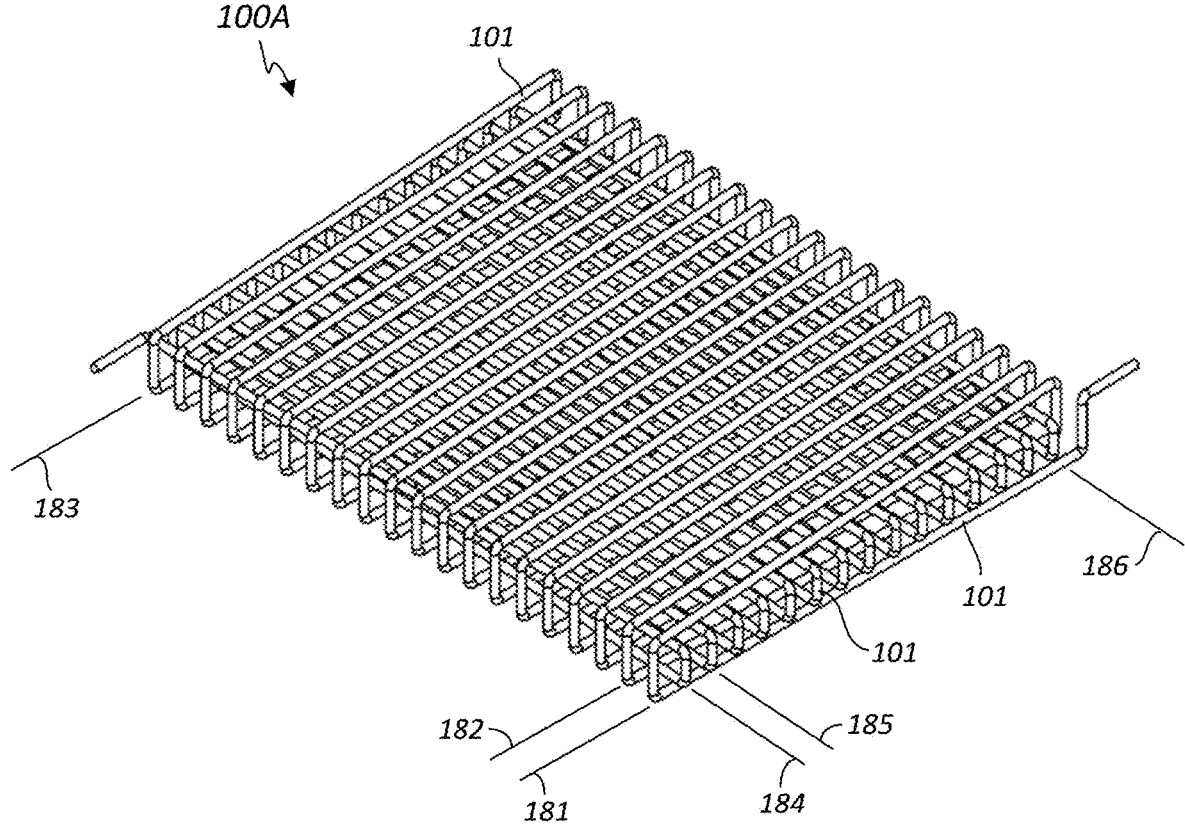
FIG. 9 shows a perspective view of an inductor, in accordance with an embodiment of the present invention.

FIG. 9 shows a perspective view of an inductor 100A, in accordance with an embodiment of the present invention. The inductor 100A is the same as the inductor 100 except that the inductor 100A has 20×15 turns. That is, in the inductor 100A, the wire 101 has 20 turns along one dimension (e.g., see lines 181, 182, and 183) and 15 turns along another dimension (e.g., see lines 184, 185, and 186). The fewer turns and smaller size of the inductor 100A results in lower inductance compared to that of the inductor 100.

Figure 10:
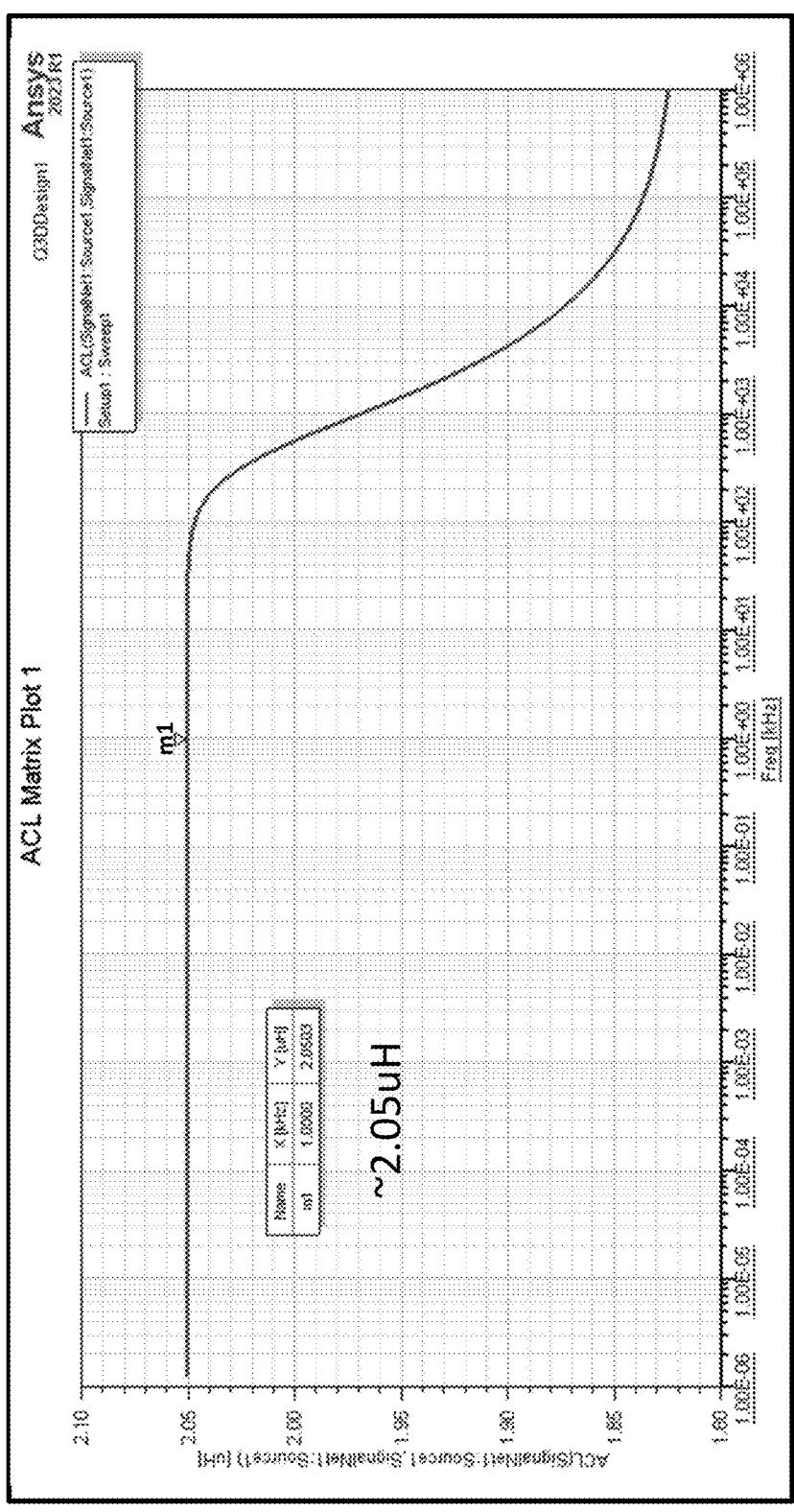
FIG. 10 shows a plot of inductance versus frequency from a simulation of the inductor of FIG. 9, in accordance with an embodiment of the present invention.

FIG. 10 shows a plot of inductance versus frequency from a simulation of the inductor 100A, in accordance with an embodiment of the present invention. The simulation was performed using the ANSYS 2023 R1 simulation software. In the simulation of FIG. 10, the wire 101 is a copper wire with a wire diameter of 30 mils; the inductor 100A has side dimensions of 60 mm×45 mm (i.e., 60 mm on the long side, and 45 mm on the short side). In FIG. 10, the vertical axis represents inductance in µH and the horizontal axis represents frequency in kHz. For reference, at the point m1 in FIG. 10, the inductor 100A in the simulation has an inductance of around 2.05 µH at around 1 kHz.

Figure 11:
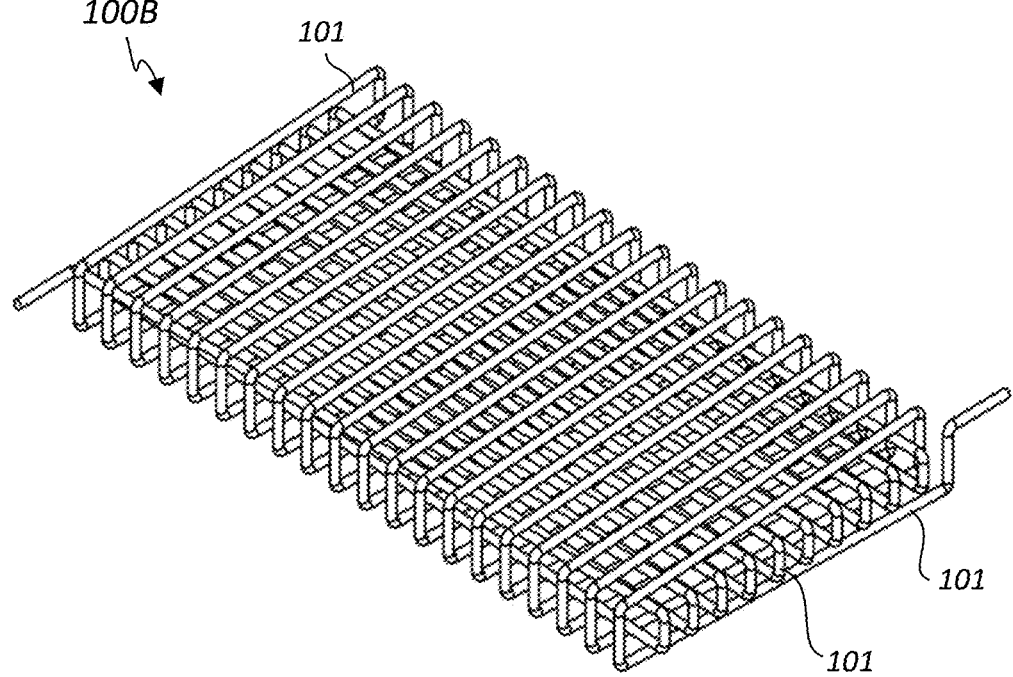
FIG. 11 shows a perspective view of an inductor, in accordance with an embodiment of the present invention.

As can be appreciated, an inductor with a mesh structure as disclosed herein may have other turn configurations. For example, FIG. 11 shows a perspective view of an inductor 100B, in accordance with an embodiment of the present invention. The inductor 100B is the same as the inductor 100 except that the inductor 100B has 20×10 turns. That is, in the inductor 100B, the wire 101 has 20 turns along one dimension and 10 turns along another dimension.

Figure 12:
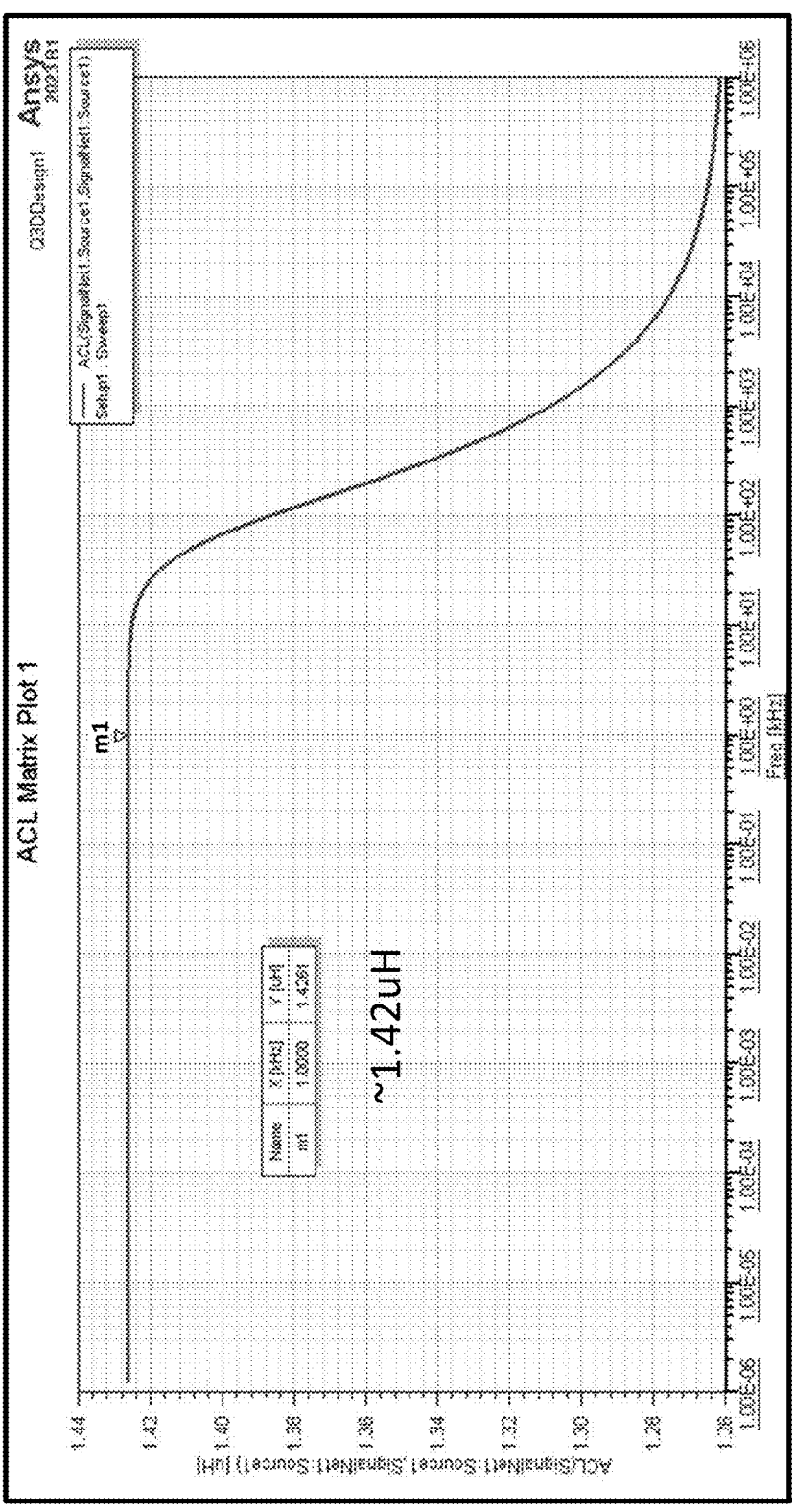
FIG. 12 shows a plot of inductance versus frequency from a simulation of the inductor of FIG. 11, in accordance with an embodiment of the present invention.

FIG. 12 shows a plot of inductance versus frequency from a simulation of the inductor 100B, in accordance with an embodiment of the present invention. The simulation was performed using the ANSYS 2023 R1 simulation software. In the simulation of FIG. 12, the wire 101 is a copper wire with a wire diameter of 30 mils, and the inductor 100B has side dimensions of 60 mm×30 mm (i.e., 60 mm on the long side, and 30 mm on the short side). In FIG. 12, the vertical axis represents inductance in µH and the horizontal axis represents frequency in kHz. For reference, at the point m1 in FIG. 12, the inductor 100B in the simulation has an inductance of around 1.42 µH at around 1 kHz.

Figure 13:
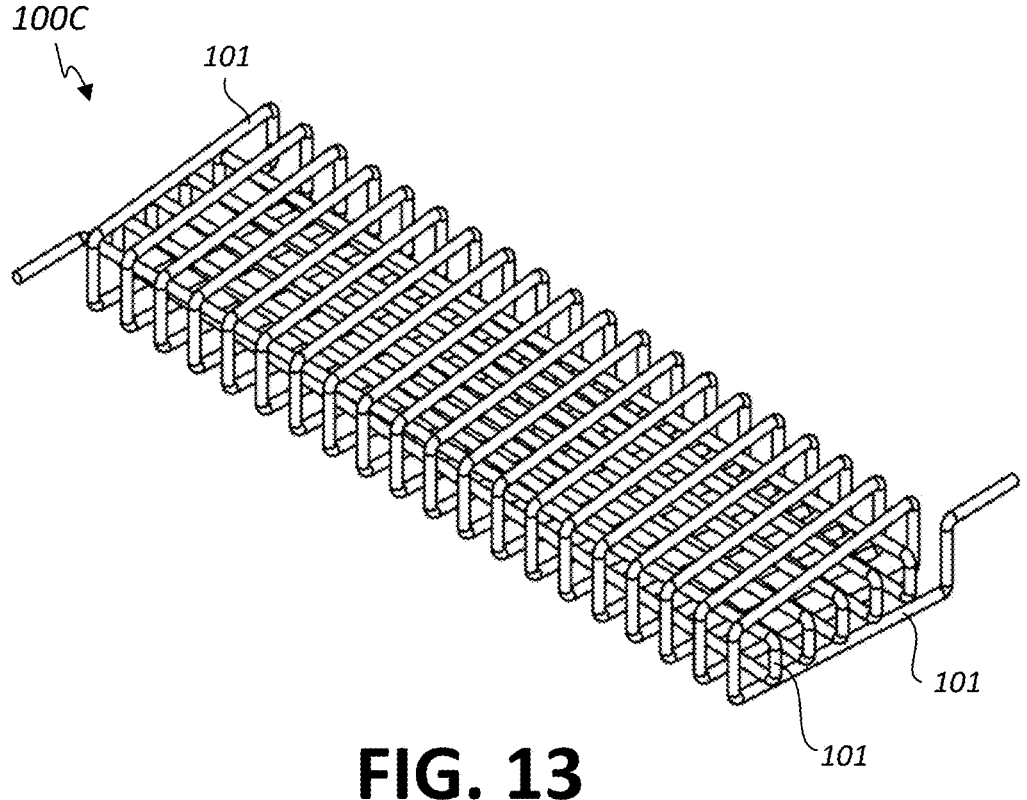
FIG. 13 shows a perspective view of an inductor, in accordance with an embodiment of the present invention.

As another example turn configuration, FIG. 13 shows a perspective view of an inductor 100C, in accordance with an embodiment of the present invention. The inductor 100C is the same as the inductor 100 except that the inductor 100C has 20×5 turns. That is, in the inductor 100C, the wire 101 has 20 turns along one dimension and 5 turns along another dimension.

Figure 14:
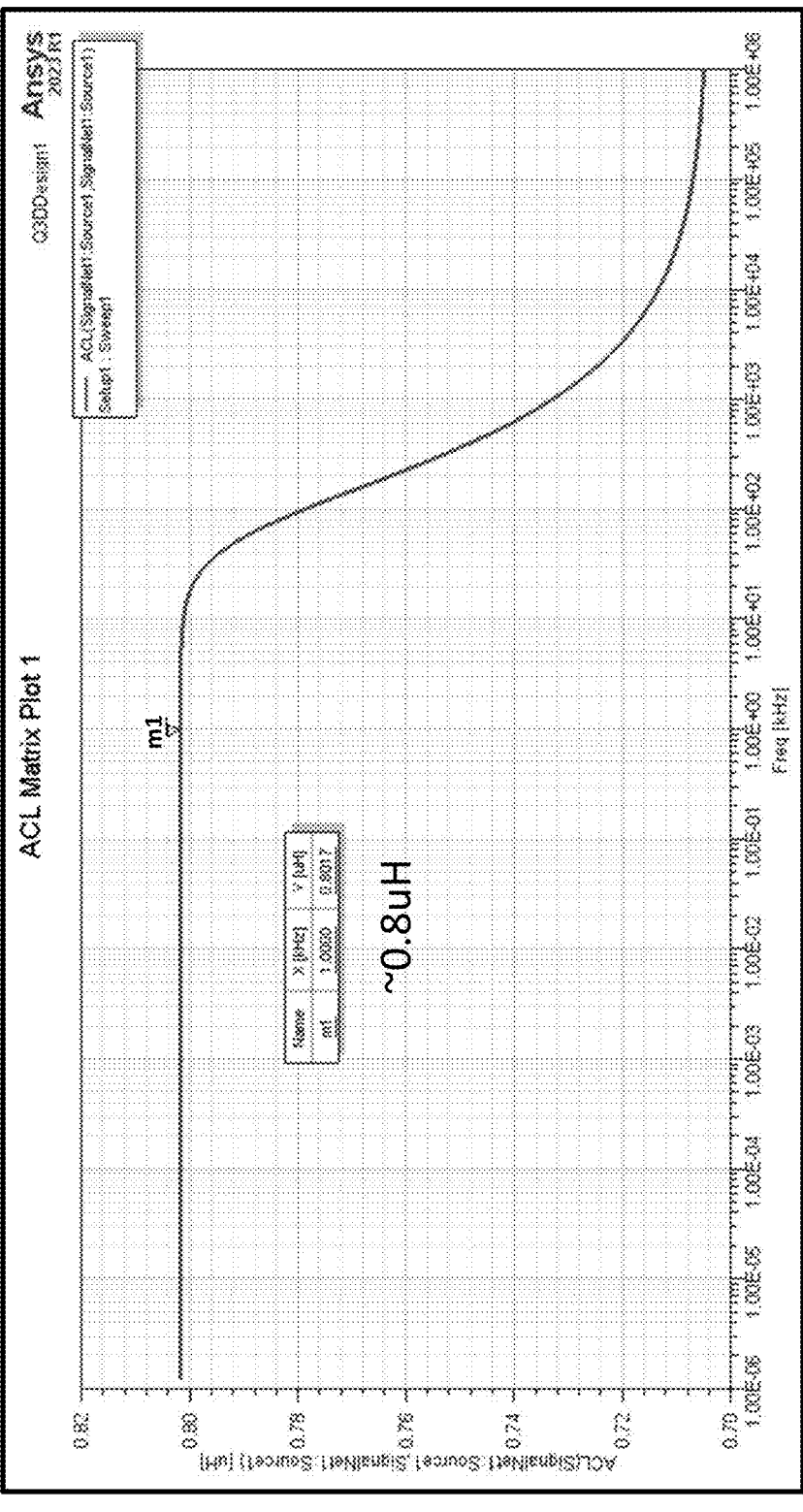
FIG. 14 shows a plot of inductance versus frequency from a simulation of the inductor of FIG. 13, in accordance with an embodiment of the present invention.

FIG. 14 shows a plot of inductance versus frequency from a simulation of the inductor 100C, in accordance with an embodiment of the present invention. The simulation was performed using the ANSYS 2023 R1 simulation software. In the simulation of FIG. 14, the wire 101 is a copper wire with a wire diameter of 30 mils, and the inductor 100C has side dimensions of 60 mm×15 mm (i.e., 60 mm on the long side, and 15 mm on the short side). In FIG. 14, the vertical axis represents inductance in µH and the horizontal axis represents frequency in kHz. For reference, at the point m1 in FIG. 14, the mesh inductor in the simulation has an inductance of around 0.8 µH at around 1 kHz.

Figure 15:
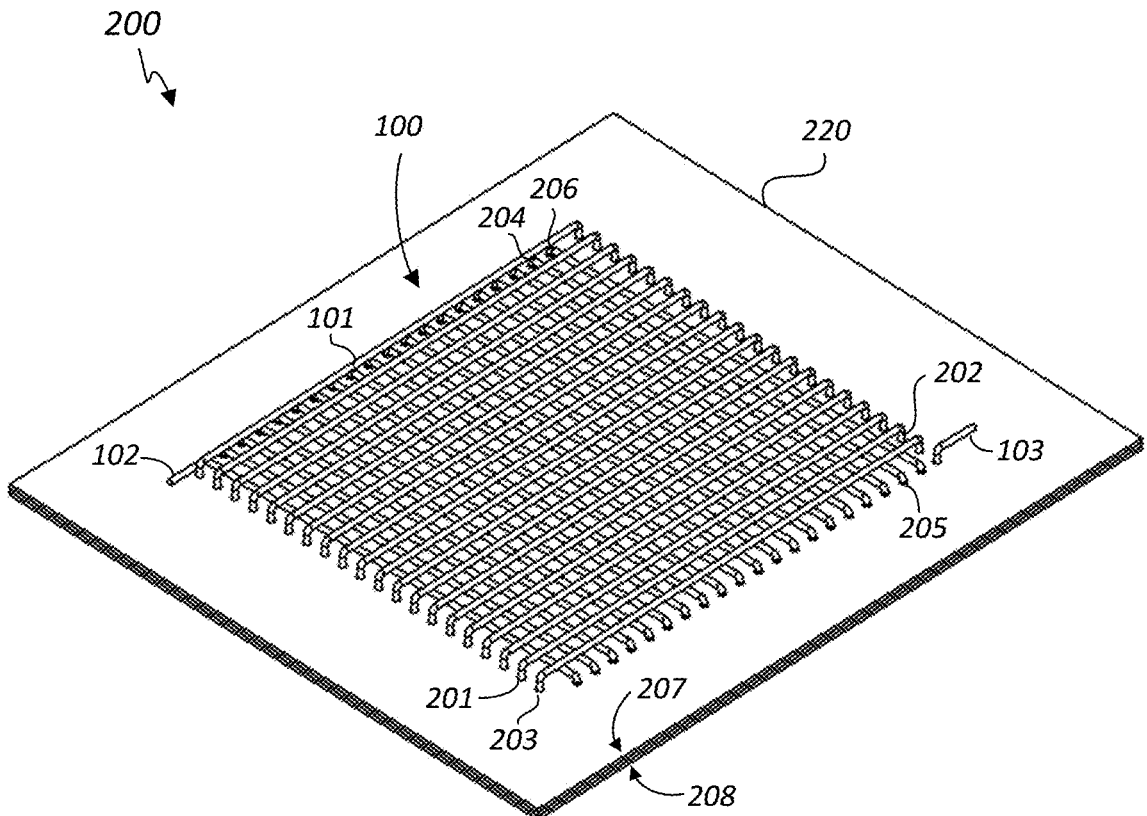
FIG. 15 shows a perspective view of an electronic assembly, in accordance with an embodiment of the present invention.

Inductors disclosed herein may be integrated with a substrate to form an electronic assembly. For example, FIG. 15 shows a perspective view of an electronic assembly 200, in accordance with an embodiment of the present invention. The electronic assembly 200 comprises a substrate 220 and the inductor 100. As can be appreciated, other inductors with a mesh structure as disclosed herein, such as the inductors 100A, 100B, 100C, etc., may also be used instead of the inductor 100.

The substrate 220 has a planar structure with solid opposing surfaces. The substrate 220 has a plurality of through holes that go all the way through the substrate 220, such as through holes 201-206. Other through holes of the substrate 220 are not labeled for clarity of the figure. In one embodiment, the substrate 220 is a printed circuit board (PCB). Only a portion of the PCB that has the inductor 100 is shown. As can be appreciated, other components may be mounted on the PCB. For example, an electrical circuit (not shown) that comprises a plurality of components may be mounted on the PCB; such electrical circuit may be electrically connected to the inductor 100.

The substrate 220 has a first surface 207 and an opposing second surface 208. Each of the first surface 207 and the second surface 208 is an outermost surface of the substrate 220. The through holes go through the first surface 207 and the second surface 208. The wire 101 extends a length between through holes on a same surface of the substrate, making the inductor 100 relatively thin. The first end 102 and the second end 103 of the wire 101 are on the first surface 207 in the example of FIG. 15. As can be appreciated, the first end 102 and the second end 103 may be on the same surface or opposing surfaces.

The wire 101 of the inductor 100 winds around the first surface 207 and the second surface 208 a plurality of turns by way of through holes of the substrate 220. For example, the wire 101 extends from the through hole 204 to the through hole 205 on the first surface 207, goes through the through hole 205 to reach the second surface 208, extends from the through hole 205 to the through hole 206 on the second surface 208, goes through the through hole 206 to reach the first surface 207 etc. Similarly, the wire 101 extends from a through hole 201 to a through hole 202 on the first surface 207, goes through the through hole 202 to reach the second surface 208, extends from the through hole 202 to the through hole 203 on the second surface 208, goes through the through hole 203 to reach the first surface 207, etc.

Figure 16:
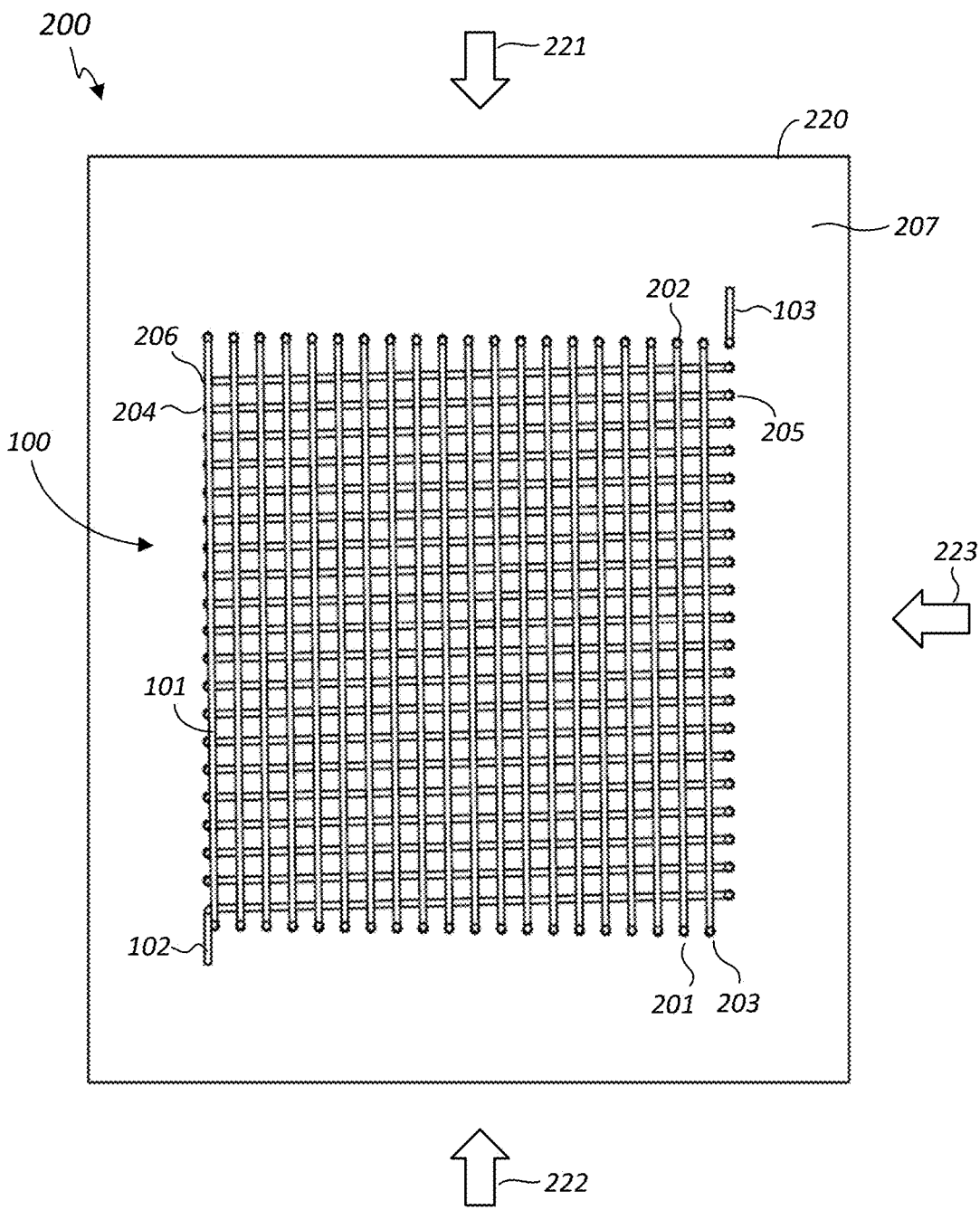
FIG. 16 shows a top view of the electronic assembly of FIG. 15, in accordance with an embodiment of the present invention.

FIG. 16 shows a top view of the electronic assembly 200, in accordance with an embodiment of the present invention. FIG. 16 shows the surface 207 of the substrate 220; the surface 208 (not shown in FIG. 16) of the substrate 220 is under the surface 207. Features of the electronic assembly 200 that are labeled in FIG. 16 are as previously described with reference to FIG. 15. Arrows 221-223 provide reference to views that are discussed with reference to FIGS. 17-19, respectively.

Figure 17:
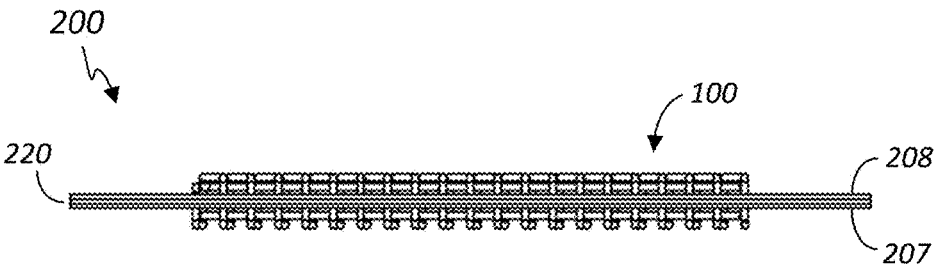
FIGS. 17-19 show side views of the electronic assembly of FIG. 15, in accordance with an embodiment of the present invention.
Figure 18:
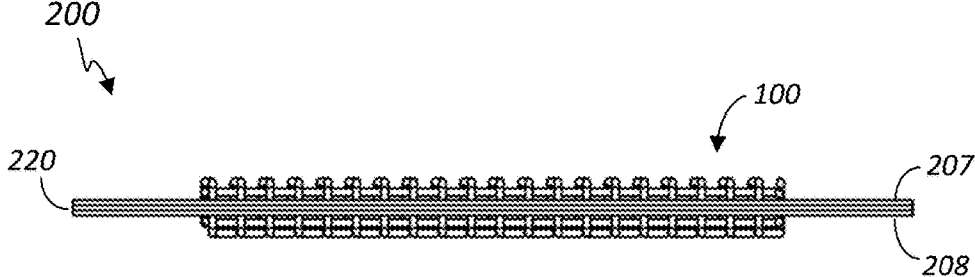
Figure 19:
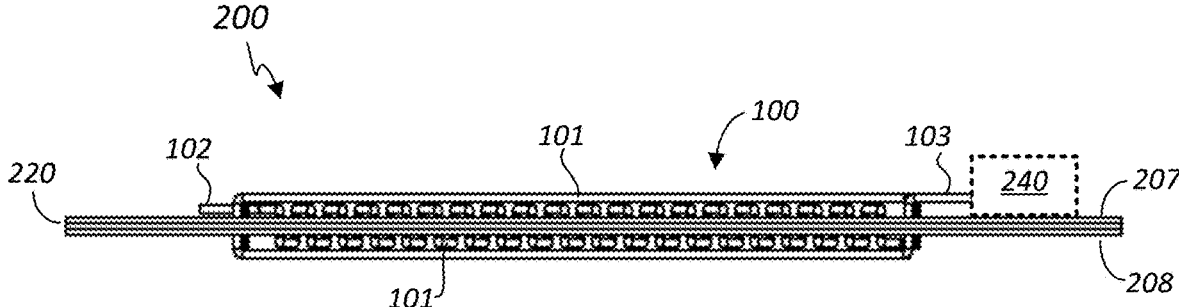

FIGS. 17-19 show side views of the electronic assembly 200, in accordance with an embodiment of the present invention. FIG. 17 shows a side view of the electronic assembly 200 as seen in the direction of arrow 221 of FIG. 16, FIG. 18 shows a side view of the electronic assembly 200 as seen in the direction of arrow 222 of FIG. 16, and FIG. 19 shows a side view of the electronic assembly 200 as seen in the direction of arrow 223 of FIG. 16. Features of the electronic assembly 200 that are labeled in FIGS. 17-19 are as previously described with reference to FIG. 15.

Generally, a PCB may accommodate a plurality of electronic components. Such electronic components may be mounted and electrically interconnected on the PCB to form one or more electrical circuits. Inductors disclosed herein may be electrically connected to electronic components of one or more electrical circuits that are mounted on the PCB. For example, FIG. 19 shows a schematic representation of an electrical circuit 240 that is electrically connected to the second end 103 of the wire 101 of the inductor 100. Such electrical circuit 240 may also be electrically connected to the first end 102, or to both the first end 102 and the second end 103 depending on the application.

Figure 20:
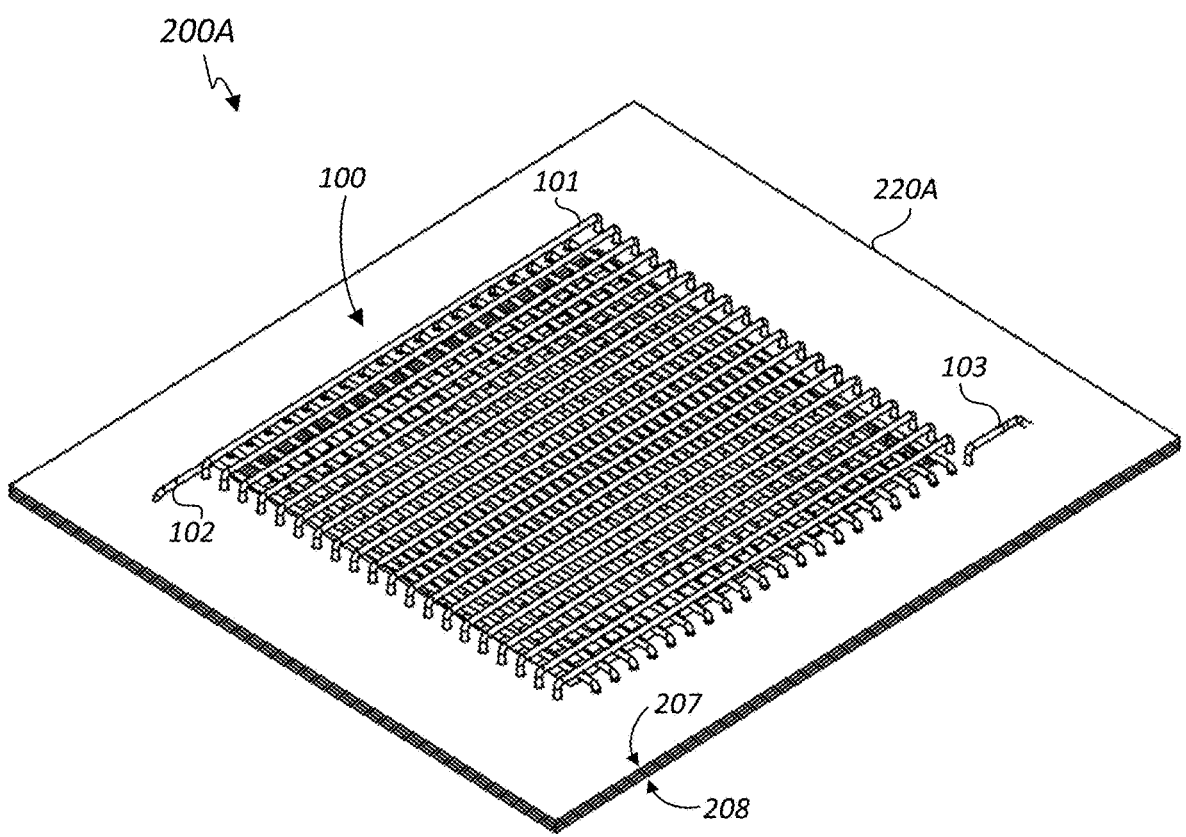
FIG. 20 shows a perspective view of an electronic assembly, in accordance with an embodiment of the present invention.

FIG. 20 shows a perspective view of an electronic assembly 200A, in accordance with an embodiment of the present invention. The electronic assembly 200A is the same as the electronic assembly 200 except that the electronic assembly 200A has a substrate 220A with a cutout (shown in FIG. 21, cutout 260) within a perimeter of the inductor 100. The wire 101 winds a first plurality of turns and a second plurality of turns through the first surface 207 and the second surface 208 by way of through holes. The first plurality of turns winds around the cutout. The second plurality of turns crosses over the first plurality of turns to wind around the first plurality of turns and the cutout. The first end 102 and the second end 103 of the wire 101 are on the surface 207 in the example of FIG. 20. As can be appreciated, the first end 102 and the second end 103 may be on the same surface or opposing surfaces of the substrate 220A.

Figure 21:
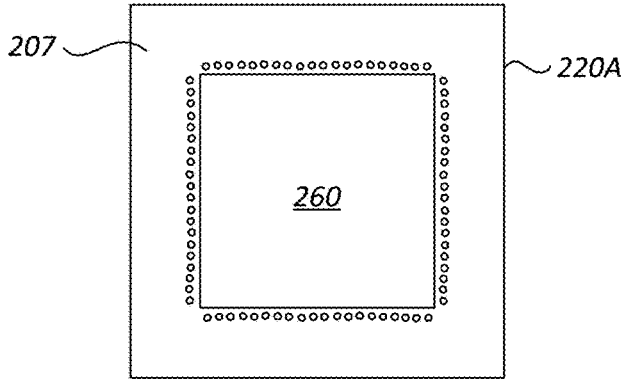
FIG. 21 shows a top view of a substrate of the electronic assembly of FIG. 20, in accordance with an embodiment of the present invention.

FIG. 21 shows a top view of the substrate 220A, in accordance with an embodiment of the present invention. The inductor 100 is not shown in FIG. 21 for clarity of illustration. As shown in FIG. 21, the plurality of through holes surround a cutout that is labeled as 260. The cutout is empty space that cuts through the first surface 207 and the second surface 208 (not shown in FIG. 21). As will be more apparent below, the cutout can accept a magnetic core. The substrate 220 and substrate 220A are otherwise the same.

Figure 22:
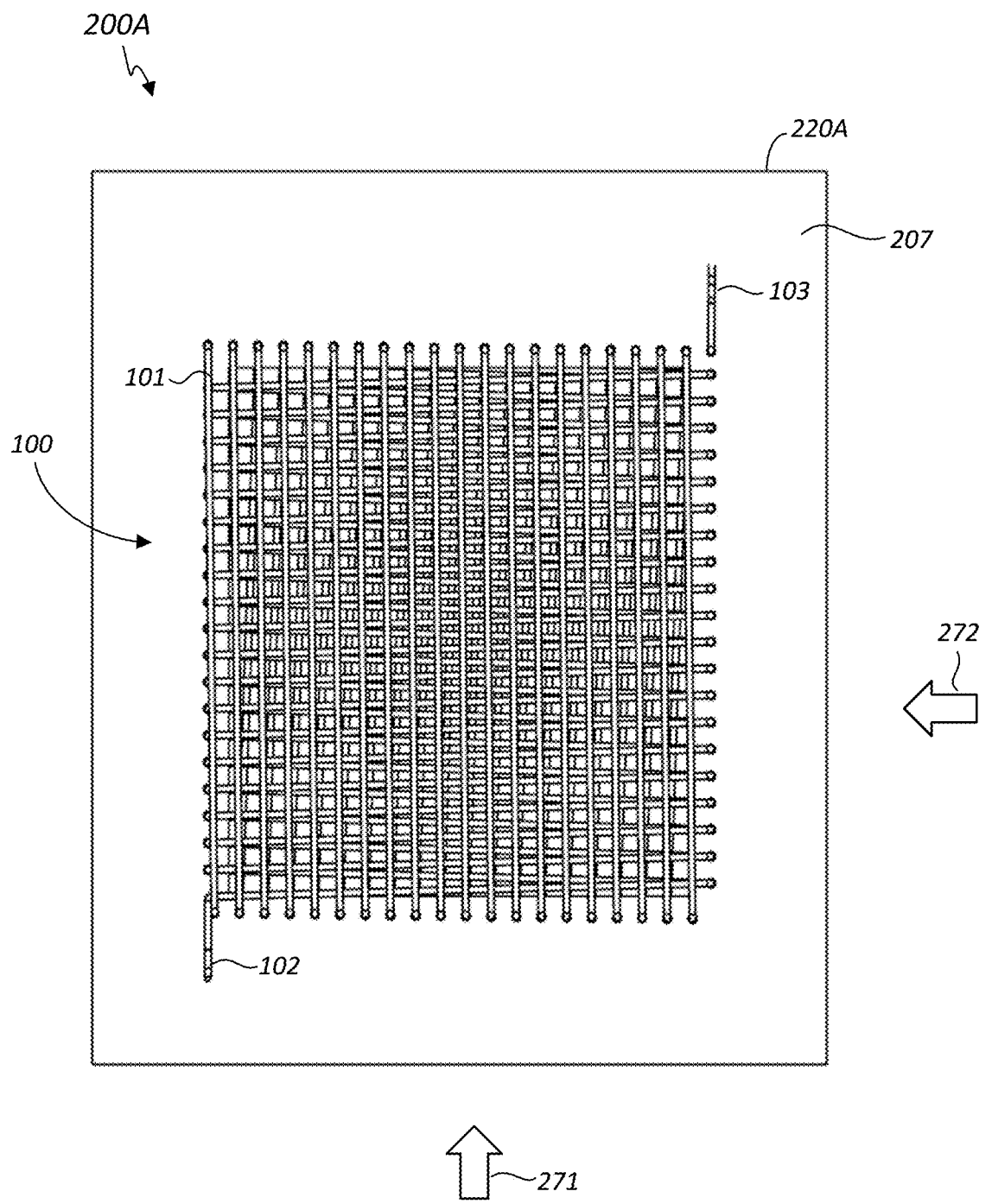
FIG. 22 shows a top view of the electronic assembly of FIG. 20, in accordance with an embodiment of the present invention.

FIG. 22 shows a top view of the electronic assembly 200A, in accordance with an embodiment of the present invention. FIG. 22 shows the surface 207 of the substrate 220A; the surface 208 (not shown in FIG. 22) of the substrate 220A is under the surface 207. Features of the electronic assembly 200A that are labeled in FIG. 22 are as previously described with reference to FIG. 20. Arrows 271 and 272 provide reference to views that are discussed with reference to FIGS. 23 and 24, respectively.

Figure 23:
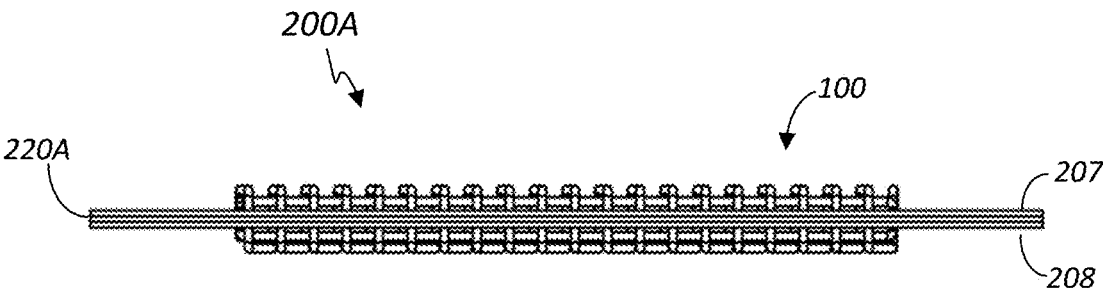
FIGS. 23 and 24 show side views of the electronic assembly of FIG. 20, in accordance with an embodiment of the present invention.
Figure 24:
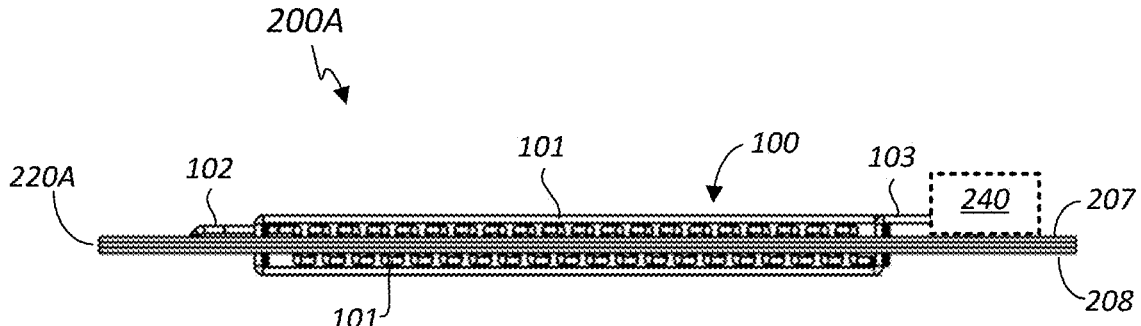

FIGS. 23 and 24 show side views of the electronic assembly 200A, in accordance with an embodiment of the present invention. FIG. 23 shows a side view of the electronic assembly 200A as seen in the direction of arrow 271 of FIG. 22, and FIG. 24 shows a side view of the electronic assembly 200A as seen in the direction of arrow 272 of FIG.

22. Features of the electronic assembly 200A that are labeled in FIGS. 23 and 24 are as previously described with reference to FIG. 20.

FIG. 24 shows a schematic representation of the electrical circuit 240 mounted on the surface 207 of the substrate 220A. In FIG. 24, the electrical circuit 240 is electrically connected to the second end 103 of the wire 101 of the inductor 100. Such electrical circuit 240 may also be electrically connected to the first end 102, or to both the first end 102 and the second end 103 depending on the application.

Figure 25:
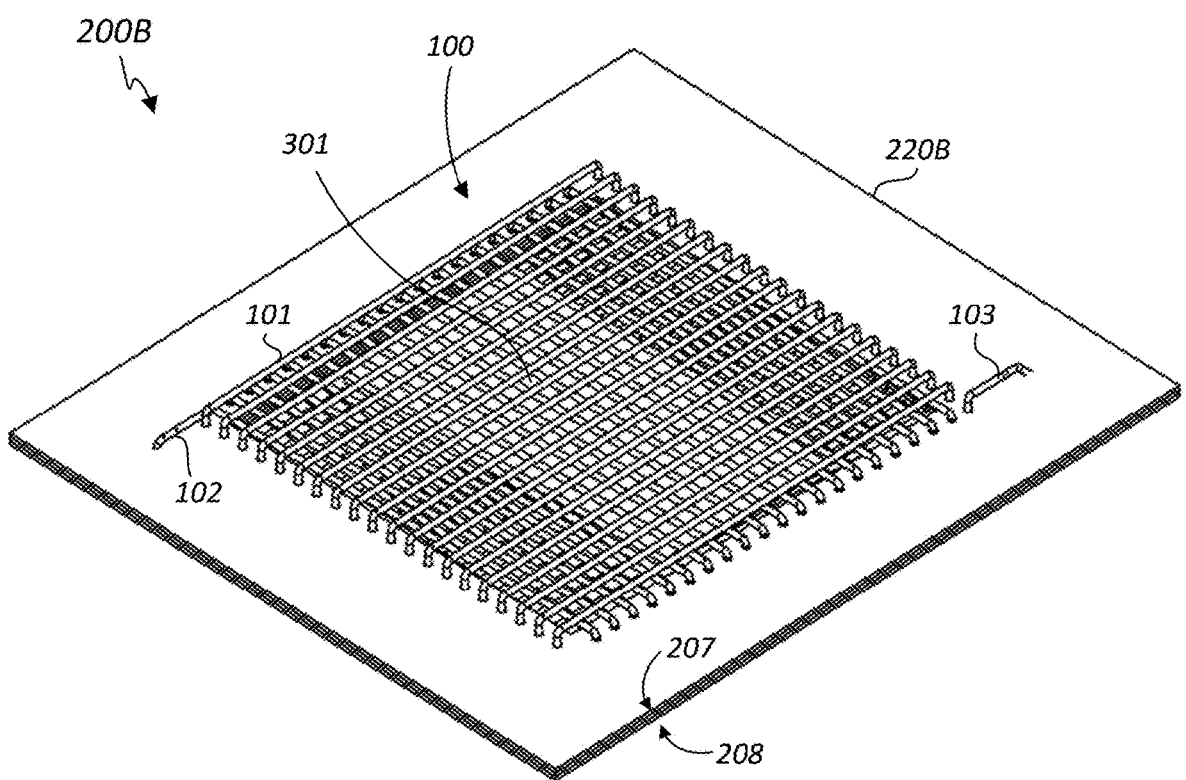
FIG. 25 shows a perspective view of an electronic assembly, in accordance with an embodiment of the present invention.

FIG. 25 shows a perspective view of an electronic assembly 200B, in accordance with an embodiment of the present invention. The electronic assembly 200B is the same as the electronic assembly 200A except that the electronic assembly 200B has a substrate 220B with a partial magnetic core 301 in the cutout within a perimeter of the inductor 100. The wire 101 winds a first plurality of turns and a second plurality of turns through the first surface 207 and the second surface 208 by way of through holes. The first plurality of turns winds around the cutout where the magnetic core 301 is disposed. The second plurality of turns crosses over the first plurality of turns to wind around the first plurality of turns and the cutout containing the magnetic core 301. The first end 102 and the second end 103 of the wire 101 are on the surface 207 in the example of FIG. 25. As can be appreciated, the first end 102 and the second end 103 of the wire 101 may be on the same surface or opposing surfaces of the substrate 220B.

Figure 26:
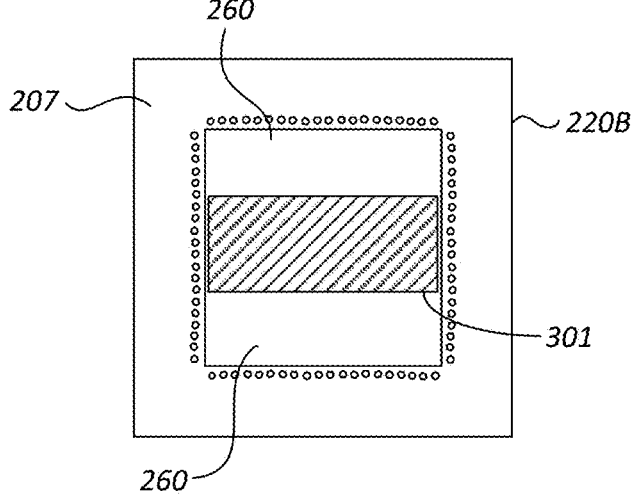
FIG. 26 shows a top view of a substrate of the electronic assembly of FIG. 25, in accordance with an embodiment of the present invention.

FIG. 26 shows a top view of the substrate 220B, in accordance with an embodiment of the present invention. The inductor 100 is not shown in FIG. 26 for clarity of illustration. As shown in FIG. 26, the plurality of through holes surround a cutout that is labeled as 260. The cutout is empty space that cuts through the first surface 207 and the second surface 208 (not shown in FIG. 26). The magnetic core 301 is disposed in the cutout. The substrate 220B and substrate 220A are otherwise the same.

The magnetic core 301 is "partial" in that it only partially fills the cutout. The magnetic core 301 may comprise a magnetic material commonly used in inductors, such as iron powder and ferrites. The magnetic core 301 may be fitted into the cutout, attached into the cutout by adhesives, held in position by support structures (not shown) in the cutout, etc. The magnetic core 301 may have a rectangular shape, cylindrical shape, two-half cylindrical shapes, or other shape that fits in the cutout. Changing the shape, size, and/or material of the magnetic core 301 allows for adjustment of the inductance of the inductor 100.

Figure 27:
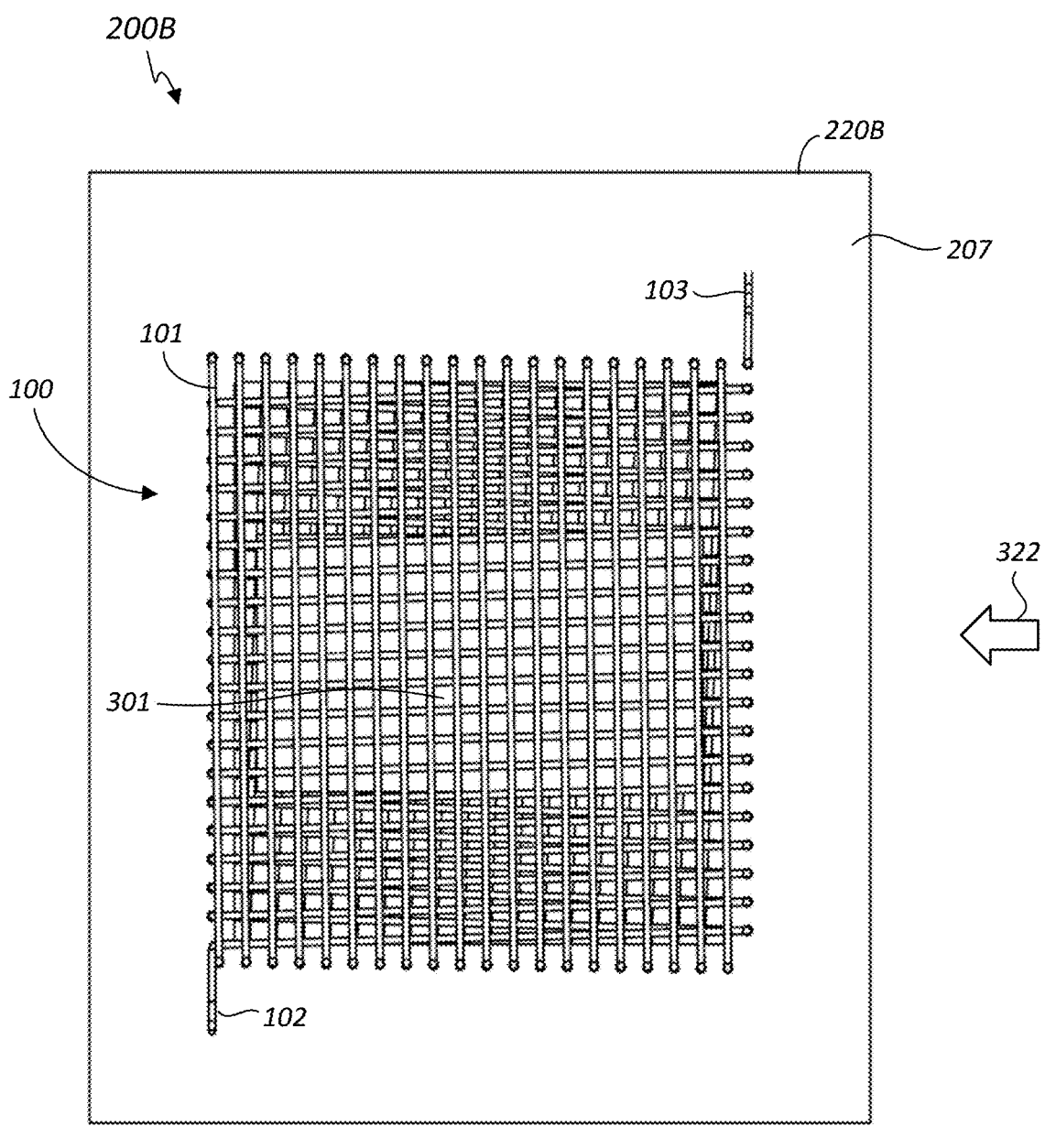
FIG. 27 shows a top view of the electronic assembly of FIG. 25, in accordance with an embodiment of the present invention.

FIG. 27 shows a top view of the electronic assembly 200B, in accordance with an embodiment of the present invention. FIG. 27 shows the surface 207 of the substrate 220B; the surface 208 (not shown in FIG. 27) of the substrate 220B is under the surface 207. Features of the electronic assembly 200B that are labeled in FIG. 27 are as previously described with reference to FIG. 25. Arrows 321 and 322 provide reference to views that are discussed with reference to FIGS. 28 and 29, respectively.

Figure 28:
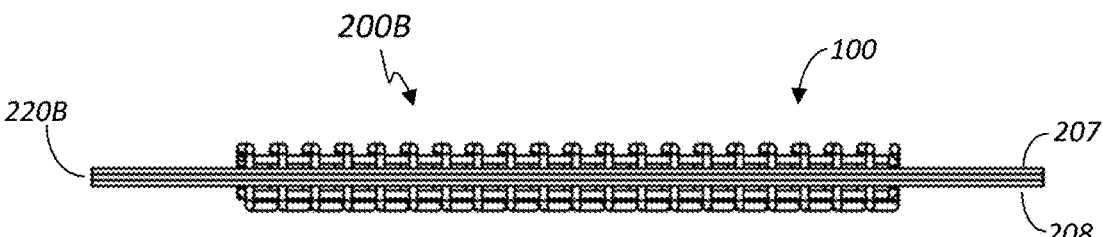
FIGS. 28 and 29 show side views of the electronic assembly of FIG. 25, in accordance with an embodiment of the present invention.
Figure 29:
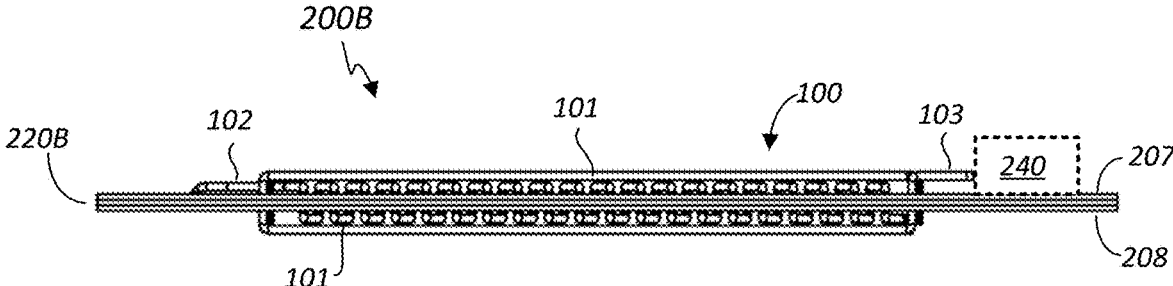

FIGS. 28 and 29 show side views of the electronic assembly 200B, in accordance with an embodiment of the present invention. FIG. 28 shows a side view of the electronic assembly 200B as seen in the direction of arrow 321 of FIG. 27, and FIG. 29 shows a side view of the electronic assembly 200B as seen in the direction of arrow 322 of FIG. 27. Features of the electronic assembly 200B that are labeled in FIGS. 28 and 29 are as previously described with reference to FIG. 25.

FIG. 29 shows a schematic representation of the electrical circuit 240 mounted on the surface 207 of the substrate 220B. In FIG. 29, the electrical circuit 240 is electrically connected to the second end 103 of the wire 101 of the inductor 100. Such electrical circuit 240 may also be electrically connected to the first end 102, or to both the first end 102 and the second end 103 depending on the application.

Figure 30:
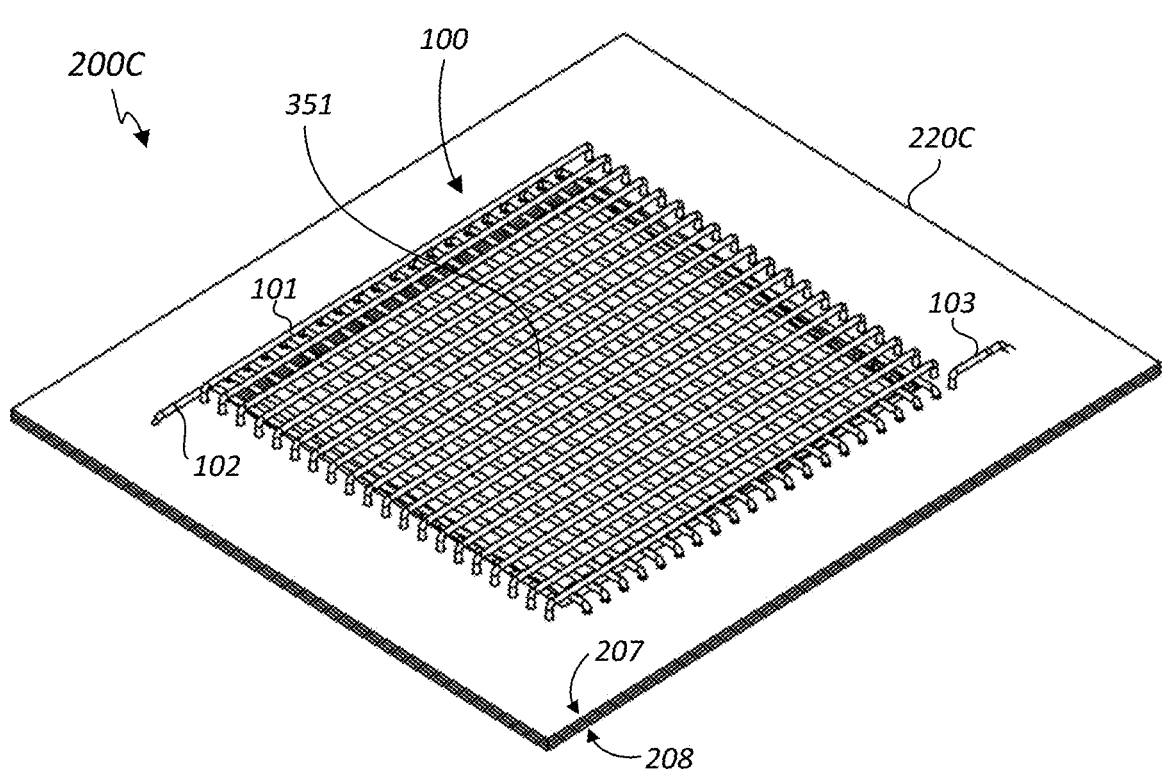
FIG. 30 shows a perspective view of an electronic assembly, in accordance with an embodiment of the present invention.

FIG. 30 shows a perspective view of an electronic assembly 200C, in accordance with an embodiment of the present invention. The electronic assembly 200C is the same as the electronic assembly 200B except that the electronic assembly 200C has a substrate 220C with a full magnetic core 351 in the cutout within a perimeter of the inductor 100. The magnetic core 351 is "full" in that it fully fills the cutout.

As shown in FIG. 30, the wire 101 winds a first plurality of turns and a second plurality of turns through the first surface 207 and the second surface 208 by way of through holes. The first plurality of turns winds around the cutout where the magnetic core 351 is disposed. The second plurality of turns crosses over the first plurality of turns to wind around the first plurality of turns and the cutout containing the magnetic core 351. The first end 102 and the second end 103 of the wire 101 are on the surface 207 in the example of FIG. 30. As can be appreciated, the first end 102 and the second end 103 of the wire 101 may be on the same surface or opposing surfaces of the substrate 220C.

Figure 31:
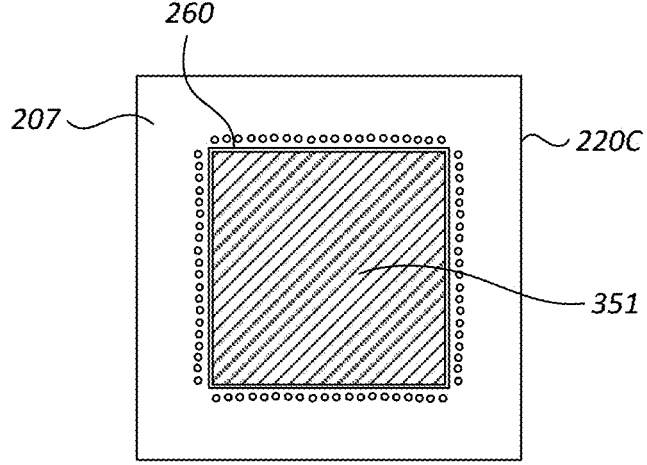
FIG. 31 shows a top view of a substrate of the electronic assembly of FIG. 30, in accordance with an embodiment of the present invention.

FIG. 31 shows a top view of the substrate 220C, in accordance with an embodiment of the present invention. The inductor 100 is not shown in FIG. 31 for clarity of illustration. As shown in FIG. 31, the plurality of through holes surround the cutout that is labeled as 260. The cutout is empty space that cuts through the first surface 207 and the second surface 208 (not shown in FIG. 31). The magnetic core 351 is disposed to fully fill the cutout. The magnetic core 351 may comprise the same magnetic material and may be disposed in the cutout in the same manner as the magnetic core 301 of the substrate 220B. The substrate 220B and substrate 220C are otherwise the same.

Figure 32:
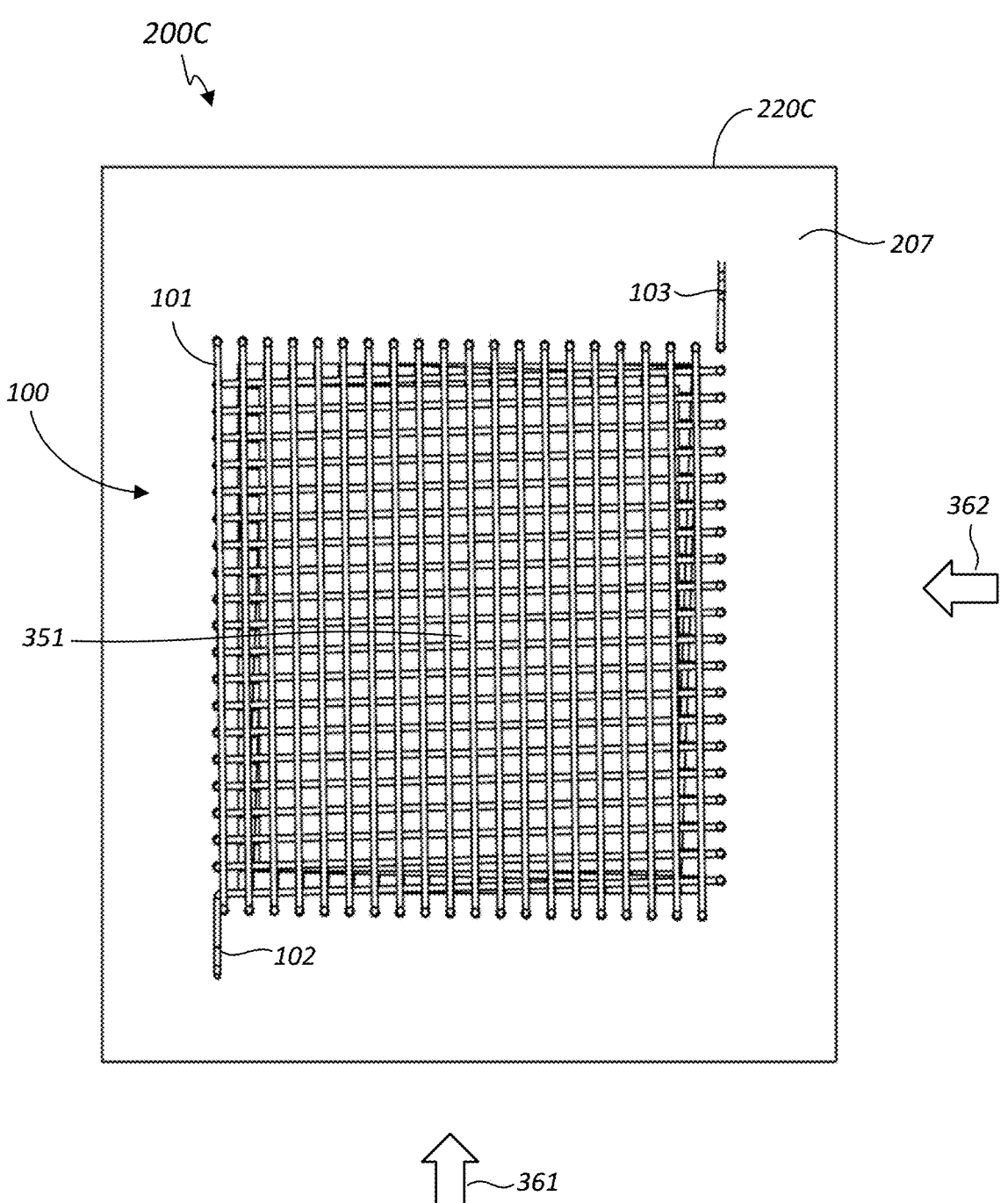
FIG. 32 shows a top view of the electronic assembly of FIG. 30, in accordance with an embodiment of the present invention.

FIG. 32 shows a top view of the electronic assembly 200C in accordance with an embodiment of the present invention. FIG. 32 shows the surface 207 of the substrate 220C; the surface 208 (not shown in FIG. 32) of the substrate 220C is under the surface 207. Features of the electronic assembly 200C that are labeled in FIG. 32 are as previously described with reference to FIG. 30. Arrows 361 and 362 provide reference to views that are discussed with reference to FIGS. 33 and 34, respectively.

Figure 33:
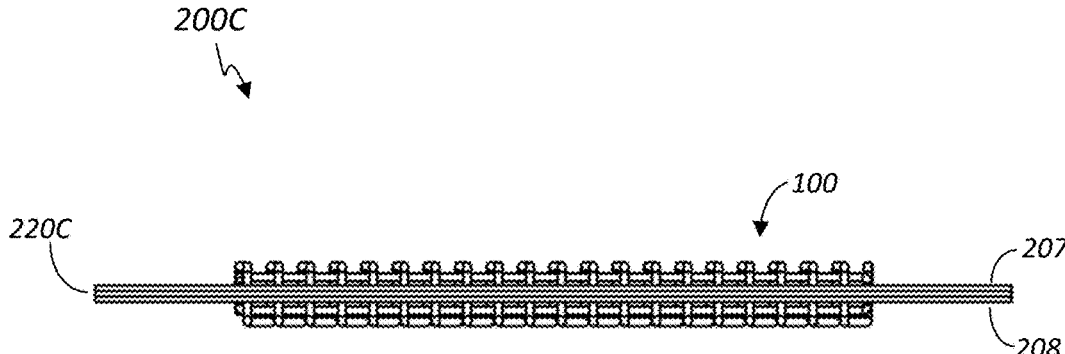
FIGS. 33 and 34 show side views of the electronic assembly of FIG. 30, in accordance with an embodiment of the present invention.
Figure 34:
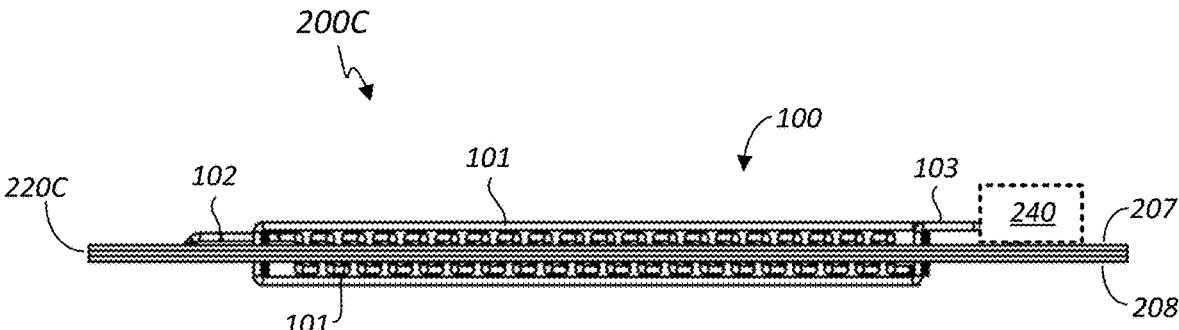

FIGS. 33 and 34 show side views of the electronic assembly 200C, in accordance with an embodiment of the present invention. FIG. 33 shows a side view of the electronic assembly 200C as seen in the direction of arrow 361 of FIG. 32, and FIG. 34 shows a side view of the electronic assembly 200C as seen in the direction of arrow 362 of FIG. 32. Features of the electronic assembly 200C that are labeled in FIGS. 33 and 34 are as previously described with reference to FIG. 30.

FIG. 34 shows a schematic representation of the electrical circuit 240 mounted on the surface 207 of the substrate 220C. In FIG. 34, the electrical circuit 240 is electrically connected to the second end 103 of the wire 101 of the inductor 100. Such electrical circuit 240 may also be electrically connected to the first end 102, or to both the first end 102 and the second end 103 depending on the application.

The substrate 220 is a PCB in the above embodiments. As can be appreciated, the mesh structure of the embodiments may also be employed as inductors in an integrated circuit (IC). In such embodiments, the wire 101 may be a wire that is suitable for wire bonding techniques and the substrate 220 is a layer of dielectric material commonly used in IC fabrication. The through holes may be vias that go through the layer of dielectric material. As before, the wire is disposed to wind a first plurality of turns and second plurality of turns through the dielectric material by way of vias, with the second plurality of turns crossing over the first plurality of turns. An electrical circuit in the IC may be electrically connected to an end of the wire 101.

The inductors disclosed herein may be employed as a discrete component, as an antenna, or an inductor of an antenna. As a particular example, both ends of the wire 101 may be connected to an electrical circuit to serve as a loop antenna of the electrical circuit.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An electronic assembly comprising:
a substrate;
an inductor comprising a wire that is wound a first plurality of turns and a second plurality of turns through the substrate by way of a plurality of through holes that go through the substrate, the second plurality of turns crosses over the first plurality of turns, and the wire extends a length on an outermost surface of the substrate between through holes of the plurality of through holes; and
an electrical circuit that is electrically connected to the inductor.

2. The electronic assembly of claim 1, wherein the substrate is a printed circuit board, and the electrical circuit is mounted on the printed circuit board.

3. The electronic assembly of claim 1, wherein the substrate is a layer of semiconductor material in an integrated circuit (IC).

4. The electronic assembly of claim 1, further comprising:
a magnetic material,
wherein the wire is wound the first plurality of turns around the magnetic material, and the wire is wound the second plurality of turns around the first plurality of turns and around the magnetic material.

5. The electronic assembly of claim 4, wherein the magnetic material is disposed within a cutout that is cut through the substrate.

6. The electronic assembly of claim 5, wherein the magnetic material partially fills the cutout.

7. The electronic assembly of claim 5, wherein the magnetic material fully fills the cutout.

8. The electronic assembly of claim 1, wherein the inductor serves as an antenna of the electrical circuit.

9. The electronic assembly of claim 1, wherein the inductor has a rectangular box shape.

10. An electronic assembly comprising:
a substrate having a plurality of through holes that go through the substrate and a cutout that is cut through the substrate;
an inductor comprising a wire that is disposed through the plurality of through holes, the wire winds a first plurality of turns around the cutout along a first dimension, the wire winds a second plurality of turns around the cutout and the first plurality of turns along a second dimension, and the wire in the second plurality of turns crosses over the wire in the first plurality of turns; and an electrical circuit that is electrically connected to the inductor.

11. The electronic assembly of claim 10, wherein the substrate is a printed circuit board.

12. The electronic assembly of claim 10, further comprising a magnetic core that is disposed in the cutout.

13. The electronic assembly of claim 12, wherein the magnetic core fully fills the cutout.

14. The electronic assembly of claim 12, wherein the magnetic core partially fills the cutout.

15. The electronic assembly of claim 10, wherein the inductor has a rectangular box shape.

16. The electronic assembly of claim 10, wherein the inductor is an antenna of the electrical circuit.

* * * * *